(12) United States Patent
Nagashima et al.

(10) Patent No.: US 11,889,689 B2
(45) Date of Patent: Jan. 30, 2024

(54) SEMICONDUCTOR MEMORY DEVICE

(71) Applicant: KIOXIA CORPORATION, Tokyo (JP)

(72) Inventors: Satoshi Nagashima, Yokkaichi Mie (JP); Fumitaka Arai, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 305 days.

(21) Appl. No.: 17/202,900

(22) Filed: Mar. 16, 2021

(65) Prior Publication Data
US 2022/0085045 A1    Mar. 17, 2022

(30) Foreign Application Priority Data
Sep. 17, 2020  (JP) .................. 2020-156442

(51) Int. Cl.
*H10B 43/10* (2023.01)
*H01L 23/528* (2006.01)
*H10B 41/10* (2023.01)
*H10B 41/27* (2023.01)
*H10B 43/27* (2023.01)

(52) U.S. Cl.
CPC ........... *H10B 43/10* (2023.02); *H01L 23/528* (2013.01); *H10B 41/10* (2023.02); *H10B 41/27* (2023.02); *H10B 43/27* (2023.02)

(58) Field of Classification Search
CPC ............... H10B 41/00–70; H10B 43/00–50
See application file for complete search history.

(56) References Cited

U.S. PATENT DOCUMENTS

| 10,020,315 | B1 | 7/2018 | Kato |
| 10,236,254 | B1 | 3/2019 | Arai |
| 2020/0091181 | A1* | 3/2020 | Nagashima ............ H10B 41/27 |
| 2020/0303403 | A1* | 9/2020 | Nakatsuka ............ H01L 23/528 |

FOREIGN PATENT DOCUMENTS

| JP | 2018-160634 A | 10/2018 |
| JP | 2019-054182 A | 4/2019 |

\* cited by examiner

*Primary Examiner* — Eric A. Ward
*Assistant Examiner* — Zachary Taylor Nix
(74) *Attorney, Agent, or Firm* — Foley & Lardner LLP

(57) ABSTRACT

According to one embodiment, a semiconductor memory device includes a first conductive layer, a second conductive layer, and at least one memory structure. The first conductive layer includes a first portion, a second portion, and a third portion, a fourth portion, and a fifth portion. The first portion is provided between the second portion and the third portion in a second direction. The second conductive layer includes a sixth portion, a seventh portion, and an eighth portion, a ninth portion, and a tenth portion. The sixth portion is provided between the seventh portion and the eighth portion in the second direction. The second portion is provided between the sixth portion and the eighth portion in the second direction.

17 Claims, 27 Drawing Sheets

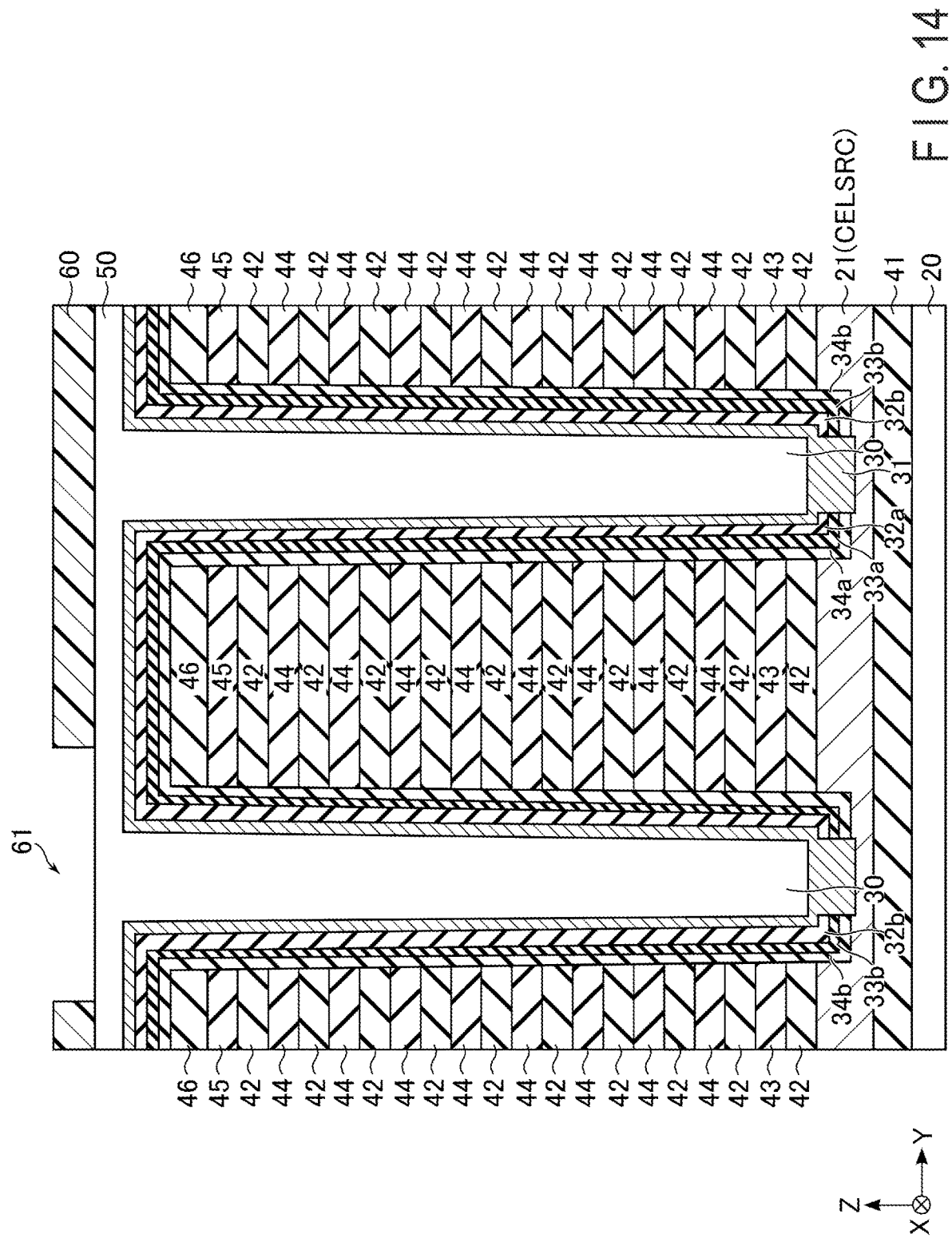
F I G. 14

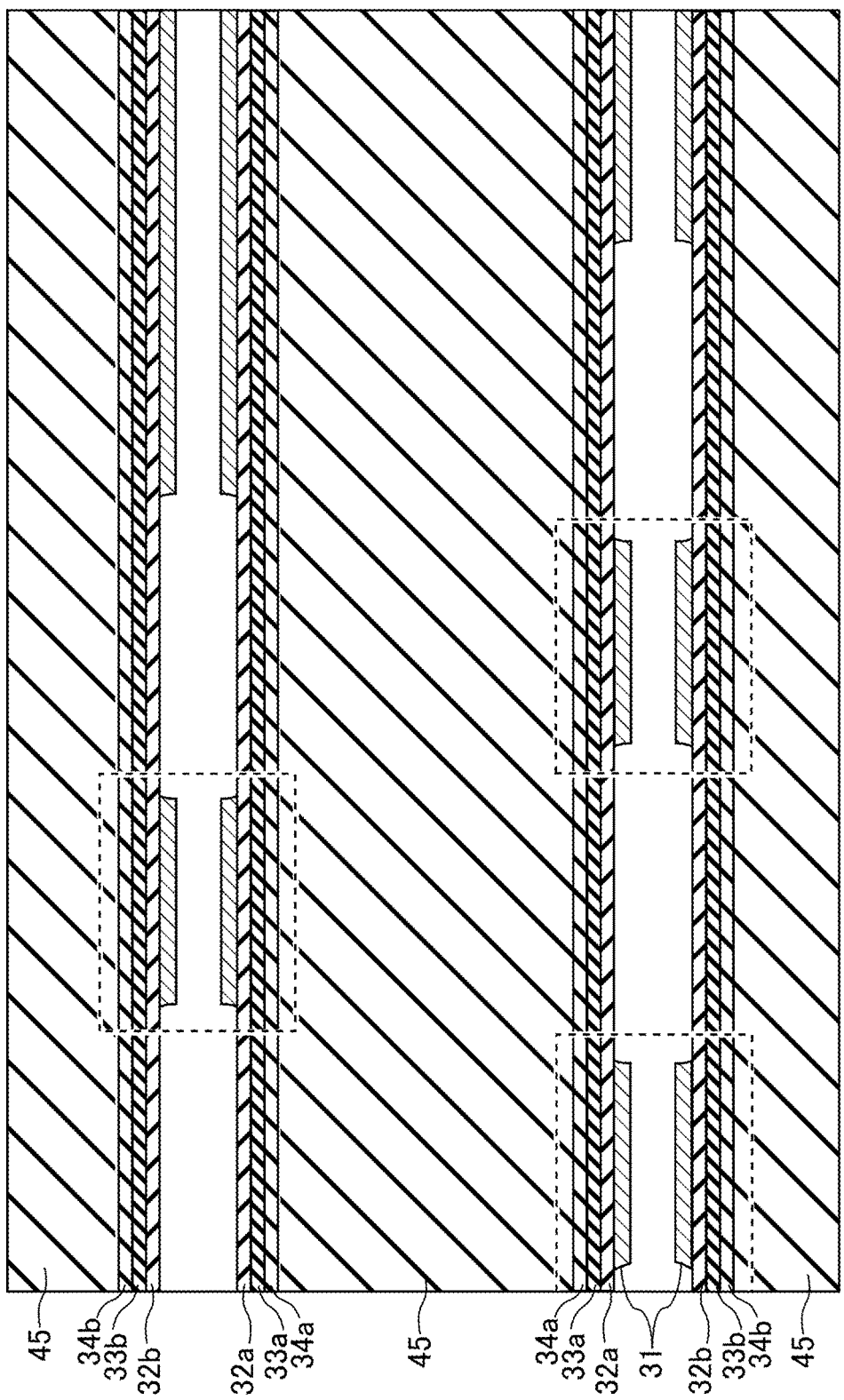
F I G. 16

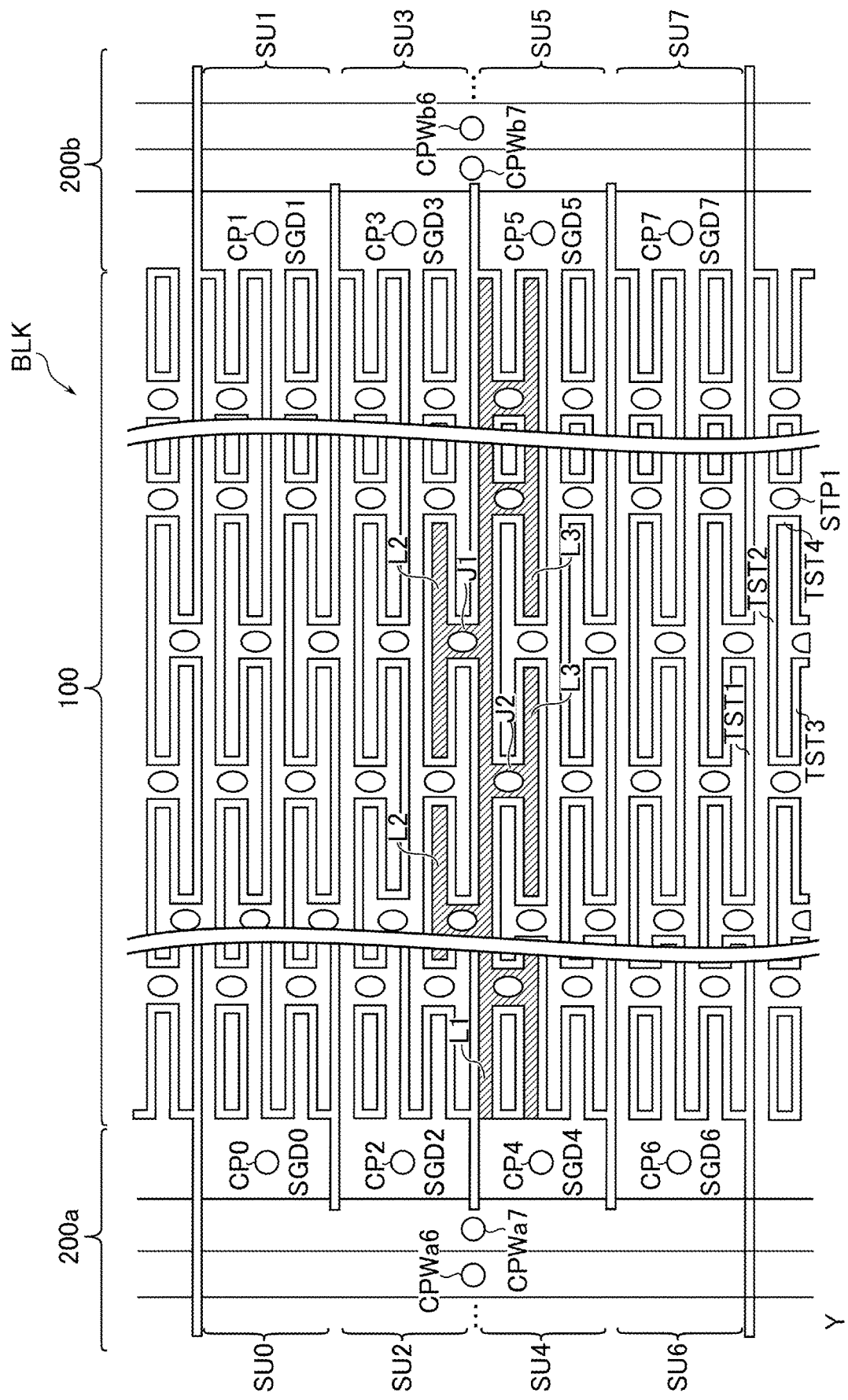
F I G. 24

SEMICONDUCTOR MEMORY DEVICE

CROSS-REFERENCE TO RELATED APPLICATIONS

This application is based upon and claims the benefit of priority from Japanese Patent Application No. 2020-156442, filed Sep. 17, 2020, the entire contents of which are incorporated herein by reference.

FIELD

Embodiments described herein relate generally to a semiconductor memory device.

BACKGROUND

A NAND flash memory having a three-dimensional memory structure is known as a semiconductor memory device capable of storing data in a non-volatile manner.

BRIEF DESCRIPTION OF THE DRAWINGS

FIG. 14 is a vertical cross-sectional view of the memory cell array taken along the line XIV-XIV of FIG. 13;

FIG. 16 is a transverse cross-sectional view of the memory cell array taken along the line XVI-XVI of FIG. 15;

FIG. 24 is a planar layout of a memory cell array of a semiconductor memory device of a first modification example as viewed from above;

DETAILED DESCRIPTION

Figure 1:
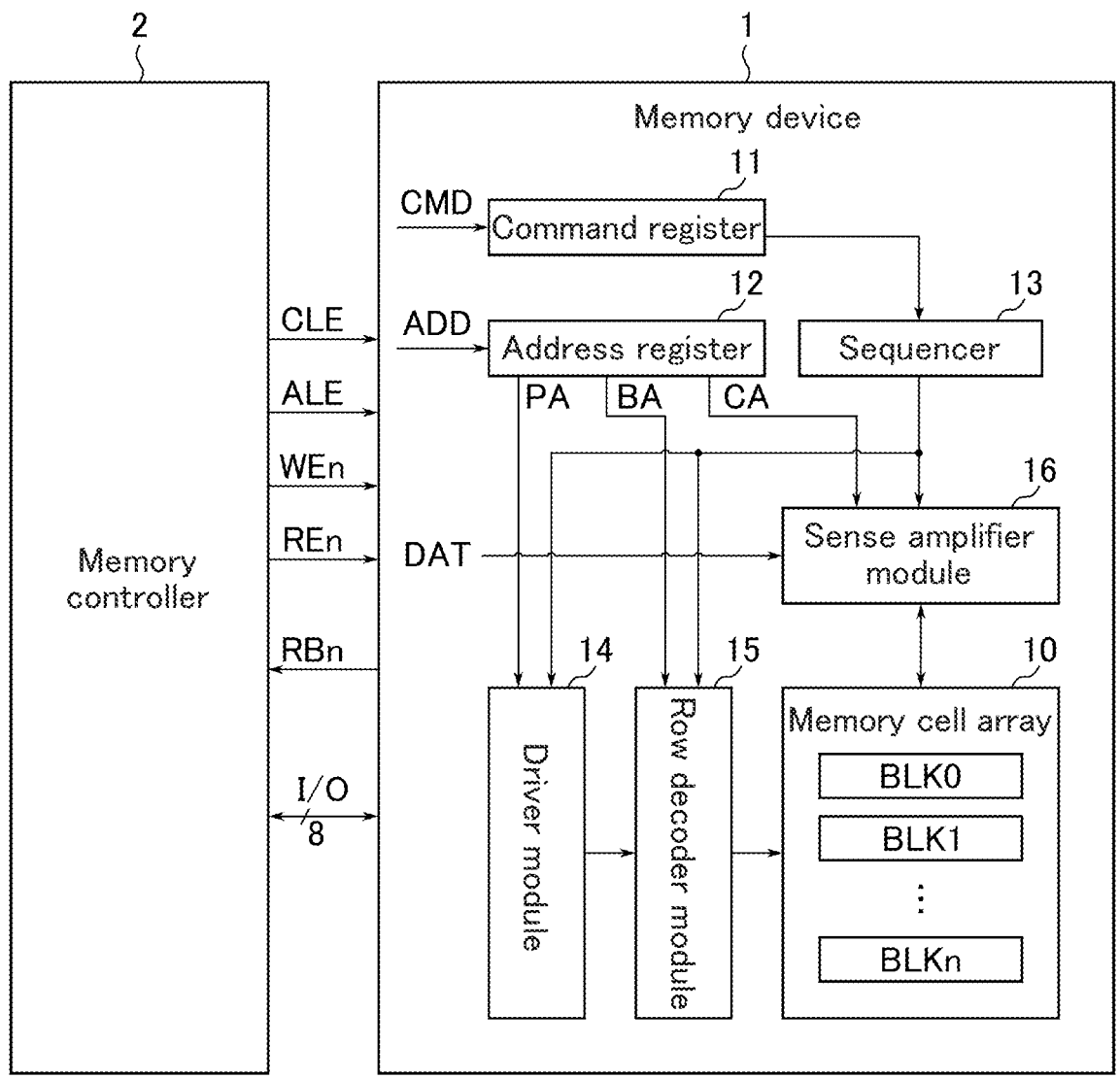
FIG. 1 is a block diagram showing a configuration of a memory system including a semiconductor memory device of an embodiment.

In general, according to one embodiment, a semiconductor memory device includes a first conductive layer and a second conductive layer provided in a first plane, and at least one memory structure provided between the first conductive layer and the second conductive layer. The first conductive layer includes a first portion, a second portion, and a third portion each extending along a first direction in the first plane, a fourth portion that connects the first portion and the second portion, and a fifth portion that connects the first portion and the third portion. The first portion is provided between the second portion and the third portion in a second direction in the first plane which intersects the first direction. The second conductive layer includes a sixth portion, a seventh portion, and an eighth portion each extending along the first direction, a ninth portion that connects the sixth portion and the seventh portion, and a tenth portion that connects the sixth portion and the eighth portion. The sixth portion is provided between the seventh portion and the eighth portion in the second direction. The second portion is provided between the sixth portion and the eighth portion in the second direction.

Hereinafter, embodiments will be described with reference to the drawings. Each embodiment illustrates a device or method for embodying the technical idea of the invention. The drawings are schematic or conceptual, and the dimensions, ratios, etc. of each drawing are not always the same as the actual ones. The technical idea of the present invention is not specified by the shape, structure, arrangement, etc. of the components.

In the following description, components having substantially the same function and configuration are designated by the same reference numerals. The number after the letter constituting the reference numeral is referred to by the reference numeral that contains the same letter and is used to distinguish elements having a similar structure. If it is not necessary to distinguish the elements denoted by the reference numeral containing the same letter, each of these elements is referred to by the reference numeral containing only the letter.

In the following description, a cross section parallel to a stacked surface of a structure stacked on a substrate may be referred to as a "transverse cross section", and a cross section intersecting the stacked surface may be referred to as a "vertical cross section".

1. Embodiment

A semiconductor memory device according to an embodiment will be described.

1.1 Configuration

First, a configuration of the semiconductor memory device according to the embodiment will be described.

1.1.1 Configuration of Semiconductor Memory Device

FIG. 1 is a block diagram for explaining a configuration of a memory system including the semiconductor memory device according to the embodiment.

The semiconductor memory device 1 is a NAND flash memory controlled by a memory controller 2 and capable of storing data in a non-volatile manner.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). Each block BLK is a set of a plurality of memory cell transistors capable of storing data in a non-volatile manner, and is used, for example, as a data erasing unit. That is, the data stored in the memory cell transistors included in the same block BLK are collectively erased. A plurality of bit lines and a plurality of word lines are provided in the memory cell array 10. Each memory cell transistor is associated with one bit line and one word line. The detailed configuration of the memory cell array 10 will be described later.

The command register 11 stores a command CMD received by the semiconductor memory device 1 from the memory controller 2. The command CMD includes, for example, an instruction to cause the sequencer 13 to execute a read operation, a write operation, an erase operation, and the like.

The address register 12 stores address information ADD received by the semiconductor memory device 1 from the memory controller 2. The address information ADD includes, for example, a block address BA, a page address PA, and a column address CA. For example, the block address BA, the page address PA, and the column address CA are used to select the block BLK, the word line, and the bit line, respectively.

The sequencer 13 controls the operation of the entire semiconductor memory device 1. For example, the sequencer 13 controls the driver module 14, the row decoder module 15, the sense amplifier module 16, and the like based on the command CMD stored in the command register 11, and executes the read operation, the write operation, the erase operation, and the like.

The driver module 14 generates a voltage used in the read operation, the write operation, the erase operation, and the like. Then, the driver module 14 applies the generated voltage to a signal line corresponding to the selected word line based on the page address PA stored in the address register 12, for example.

The row decoder module 15 selects one block BLK based on the address information ADD received by the semiconductor memory device 1 from the memory controller 2. Then, the row decoder module 15 outputs the required voltage to the block BLK.

The sense amplifier module 16 senses a threshold voltage of the memory cell transistor to be read in the memory cell array 10 during the data read operation. Then, the sense result is read out and output to the memory controller 2 as data DAT. During the data writing operation, the write data DAT received from the external memory controller 2 is transferred to the memory cell array 10.

The semiconductor memory device 1 is connected to the memory controller 2 by, for example, an NAND bus.

In the NAND bus, transmission and reception are performed for a command latch enable signal CLE, an address latch enable signal ALE, a write enable signal WEn, a read enable signal REn, a ready/busy signal RBn, and an input/output signal I/O according to the NAND interface via individual signal lines. The signal CLE notifies the semiconductor memory device 1 that the signal I/O flowing through the semiconductor memory device 1 is a command while the signal CLE is at a "H (High)" level. The signal ALE notifies the semiconductor memory device 1 that the signal I/O flowing through the semiconductor memory device 1 is an address while the signal ALE is at a "H" level. The signal WEn instructs the semiconductor memory device 1 to take in the signal I/O flowing through the semiconductor memory device 1 while the signal WEn is at a "L (Low)" level. The signal REn instructs the semiconductor memory device 1 to output the signal I/O. The signal RBn indicates whether the semiconductor memory device 1 is in a ready state (a state of accepting an instruction from the outside) or a busy state (a state of not accepting an instruction from the outside). The signal I/O is, for example, an 8-bit signal.

The signal I/O is transmitted and received between the semiconductor memory device 1 and the memory controller 2, and includes the command CMD, the address ADD, and the data DAT.

The semiconductor memory device 1 and the memory controller 2 described above may form one memory system by combining them. Examples of such a memory system include a memory card such as an SDTM card and an SSD (solid state drive).

1.1.2 Configuration of Memory Cell Array

Figure 2:
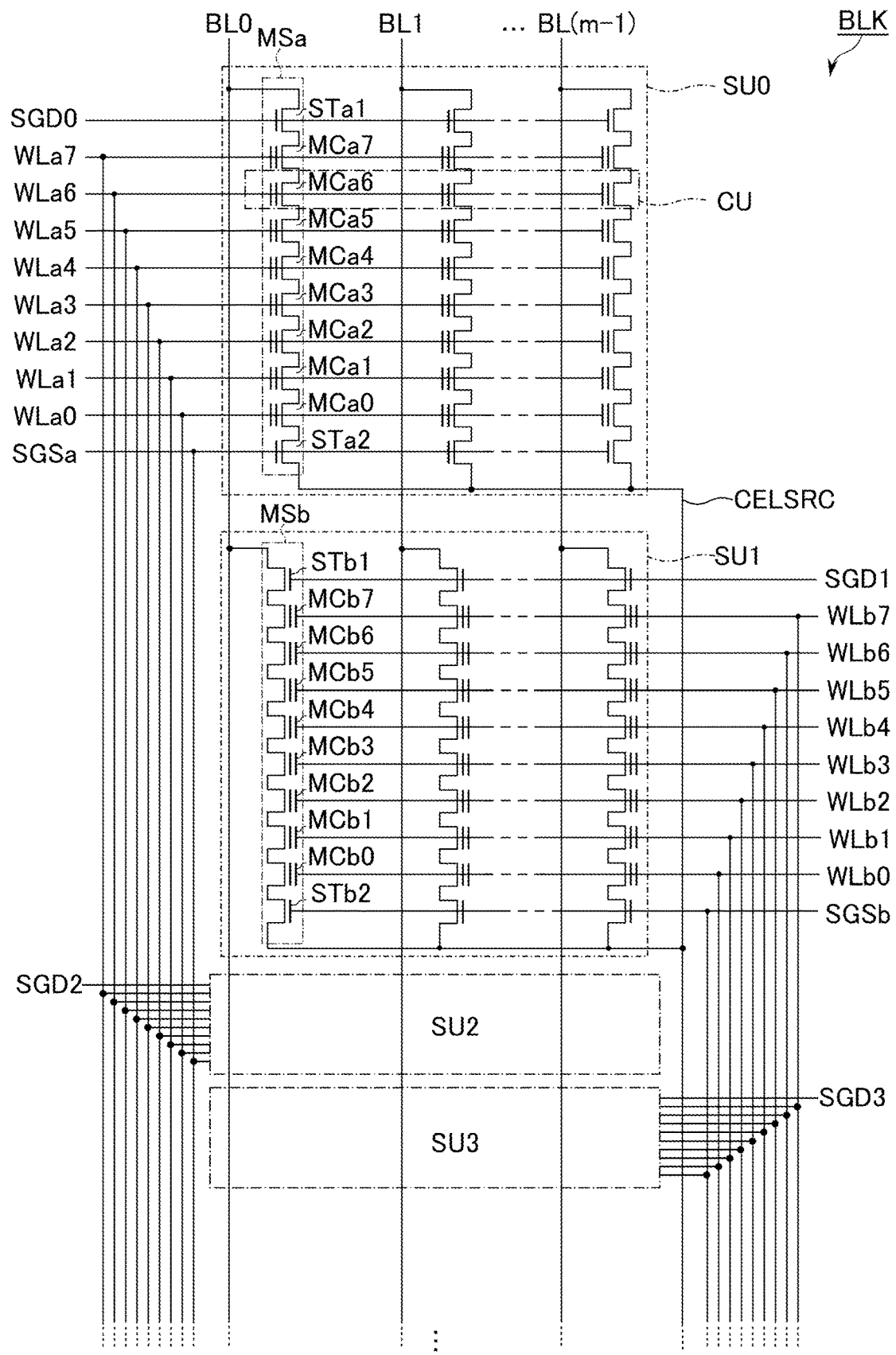
FIG. 2 is a circuit configuration diagram showing a memory cell array of the semiconductor memory device of the embodiment.

Next, the configuration of the memory cell array 10 will be described with reference to FIG. 2. FIG. 2 is an equivalent circuit diagram of the memory cell array 10 according to the embodiment. The example of FIG. 2 shows one of the blocks BLK in the memory cell array 10, but the configurations of the other blocks BLK are the same.

As shown in FIG. 2, the block BLK includes, for example, eight string units SU (SU0, SU1, SU2, SU3, . . . , SU7). In the example of FIG. 2, four (SU0 to SU3) of the eight string units SU0 to SU7 are shown.

Each of the string units SU includes a plurality of memory strings MS. In the following, in the case of distinguishing between the memory strings MS in a string unit SUa (any of SU0, SU2, SU4, and SU6) and the memory strings MS in a string unit SUb (any of SU1, SU3, SU5, and SU7), they are referred to as memory strings MSa and MSb, respectively. Also, regarding other configurations and wirings, etc., if necessary, "a" is added as a subscript to those corresponding to the string unit SUa, and "b" is added as a subscript to those corresponding to the string unit SUb, and they are distinguished from each other.

The memory string MS includes, for example, eight memory cell transistors MC (MC0 to MC7) and select transistors ST1 and ST2. The memory cell transistor MC includes a control gate and a charge storage film, and stores data in a non-volatile manner. The eight memory cell transistors MC are connected in series between a source of the select transistor ST1 and a drain of the select transistor ST2.

A gate of the select transistor STa1 included in the string unit SUa (SU0, SU2, SU4, and SU6) is connected to a select gate line SGDa (SGD0, SGD2, SGD4, and SGD6). A gate of the select transistor STb1 included in the string unit SUb (SU1, SU3, SU5, and SU7) is connected to a select gate line SGDb (SGD1, SGD3, SGD5, and SGD7). The select gate lines SGD0 to SGD7 are independently controlled by the row decoder module 15.

Further, a gate of a select transistor STa2 included in the string unit SUa in the same block BLK is commonly connected to, for example, a select gate line SGSa, and a gate of a select transistor STb2 included in the string unit SUb in the same block BLK is commonly connected to, for example, a select gate line SGSb. The select gate lines SGSa and SGSb may be connected in common or may be independently controllable, for example.

Further, a control gate of a memory cell transistor MCa (MCa0 to MCa7) included in the string unit SUa in the same block BLK is commonly connected to a word line WLa (WLa0 to WLa7). Meanwhile, a control gate of a memory cell transistor MCb (MCb0 to MCb7) included in the string unit SUb is commonly connected to a word line WLb (WLb0 to WLb7). The word lines WLa and WLb are independently controlled by the row decoder module 15.

Further, a drain of the select transistor ST1 of the memory string MS in the same row in the memory cell array 10 is commonly connected to a bit line BL (BL0 to BL (m-1), where m is a natural number). That is, the bit line BL is commonly connected to one memory string MSa in each of the plurality of string units SUa and one memory string MSb in each of the plurality of string units SUb. Further, sources of the plurality of select transistors ST2 are commonly connected to a source line CELSRC.

That is, the string unit SU is a set of a plurality of memory strings MS respectively connected to different bit lines BL and connected to the same select gate line SGD. In the string unit SU, a set of memory cell transistors MC commonly connected to the same word line WL is also referred to as a cell unit CU. The block BLK is a set of a plurality of string units SUa sharing the same word lines WLa0 to WLa7 and a plurality of string units SUb sharing the same word lines WLb0 to WLb7. Further, the memory cell array 10 is a set of a plurality of blocks BLK sharing a plurality of bit lines BL with each other.

In the memory cell array 10, the select gate line SGS, the word lines WL, and the select gate line SGD are sequentially stacked on a semiconductor substrate, so that the memory cell transistors MC and the select transistors ST1 and ST2 are three-dimensionally stacked.

1.1.3 Layout of Memory Cell Array

Next, the layout of the memory cell array 10 according to the embodiment will be described with reference to FIG. 3.

Figure 3:
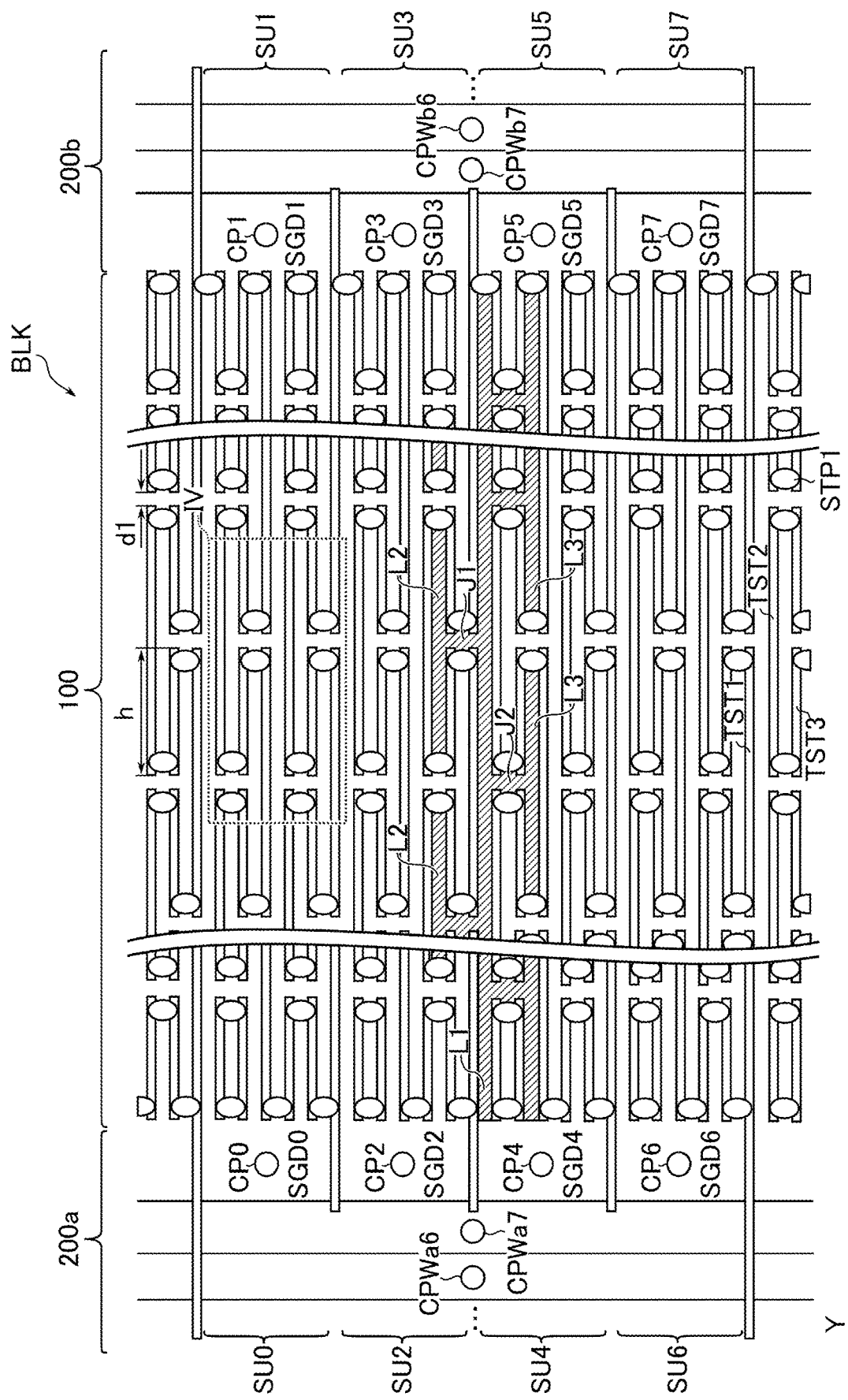
FIG. 3 is a planar layout of the memory cell array of the semiconductor memory device of the embodiment as viewed from above.

FIG. 3 is an example of a planar layout of the memory cell array 10 in the semiconductor memory device 1 according to the embodiment. In FIG. 3, components such as interlayer insulating films and wirings are appropriately omitted in order to make the figure easier to see. In the following description, the two directions parallel to the surface of the semiconductor substrate and orthogonal to each other are defined as the X direction and the Y direction, and the direction orthogonal to the plane including the X direction and the Y direction (XY plane) is defined as the Z direction (laminating direction).

As shown in FIG. 3, the memory cell array 10 includes a cell region 100 and a hookup region 200 (200a and 200b). The hookup regions 200a and 200b are arranged at both ends of the cell region 100 along the X direction so as to sandwich the cell region 100 along the X direction. That is, the hookup region 200a is arranged at one end of the cell region 100 in the X direction, and the hookup region 200b is arranged at the other end of the cell region 100 in the X direction.

In the cell region 100 and the hookup region 200a, a plurality of first stacked bodies arranged along the Y direction are provided, and in the cell region 100 and the hookup region 200b, a plurality of second stacked bodies arranged along the Y direction are provided. The plurality of first stacked bodies and the plurality of second stacked bodies are separated from each other by a plurality of trench structures TST (TST1, TST2, and TST3) extending along the Z direction and a plurality of pillars STP1.

A pair of one first stacked body and one second stacked body adjacent to each other along the X direction corresponds to, for example, one block BLK. In plan view, the first stacked body and the second stacked body belonging to one block BLK have substantially the same shape, and for example, are arranged at positions that are point-symmetrical to each other with respect to the center of the cell region 100 provided with the first stacked body and the second stacked body.

The first stacked body has a structure in which the select gate line SGSa, the word lines WLa0 to WLa7, and the select gate line SGDa are stacked along the Z direction. The second stacked body has a structure in which the select gate line SGSb, the word lines WLb0 to WLb7, and the select gate line SGDb are stacked along the Z direction.

The select gate lines SGSa and SGSb are provided on the same layer, word lines WLai and WLbi (i is an integer of 0 or more and 7 or less) are provided on the same layer, and the select gate lines SGDa and SGDb are provided on the same layer. The word line WLa0 and the word line WLb0 are provided on the layer above the select gate lines SGSa and SGSb, the word lines WLaj and WLbj (j is an integer of 1 or more and 7 or less) are provided on the layer above the word lines WLa(j-1) and WLb(j-1), and the select gate lines SGDa and SGDb are provided on the layer above the word lines WLa7 and WLb7.

In the following description, the select gate lines SGD and SGS and the word lines WL may be collectively referred to as a "stacked wiring".

First, the cell region 100 will be described.

In the cell region 100, the plurality of trench structures TST are provided at intervals d1 along the X direction. The plurality of trench structures TST form three arrangement patterns in which the combination of length and position along the X direction is different from each other. Specifically, among the plurality of trench structures TST, a plurality of trench structures TST1 form a first arrangement pattern, a plurality of trench structures TST2 form a second arrangement pattern, and a plurality of trench structures TST3 form a third arrangement pattern. In both the first arrangement pattern and the second arrangement pattern, the plurality of trench structures TST1 and TST2 each having a length (2h+d1) along the X direction are provided at the intervals d1. The trench structure TST1 and the trench structure TST2 are provided at positions shifted in the X direction by a length (h+d1) from each other. In the third arrangement pattern, the plurality of trench structures TST3 having a length h along the X direction are provided at the intervals d1. The positions of both ends of the trench structure TST3 along the X direction are aligned with the positions of both ends of the trench structures TST1 and TST2 along the X direction. The first arrangement pattern, the second arrangement pattern, and the third arrangement pattern of the trench structures TST as described above are repeatedly arranged in this order along the Y direction.

Further, the cell region 100 is provided with the plurality of pillars STP1 having an elliptical shape in which the major axis direction is parallel to the Y direction and the minor axis direction is parallel to the X direction in plan view. Each of the plurality of pillars STP1 is provided so as to overlap, for example, the end portion of the trench structure TST3 and the end portion of the trench structure TST1 or TST2 adjacent to the trench structure TST3 along the Y direction. The shape of the pillar STP1 in plan view is not limited to an elliptical shape, and may be, for example, a rectangular shape. In this case, the pillar STP1 may have a shape in which the long side is parallel to the Y direction and the short side is parallel to the X direction in plan view.

Due to the arrangement of the trench structures TST and the pillars STP1 as described above, the first stacked body and the second stacked body are separated from each other.

In plan view, the first stacked body and the second stacked body each have four branch-like wiring regions having the same shape in the cell region 100. The four wiring regions of the first stacked body correspond to the select gate lines SGD0, SGD2, SGD4, and SGD6, respectively, and the four wiring regions of the second stacked body correspond to the select gate lines SGD1, SGD3, SGD5, and SGD7, respectively. The eight wiring regions respectively corresponding to the select gate lines SGD7 to SGD0 are arranged in this order along the Y direction. In the following, as an example of one wiring region, the shape corresponding to the select gate line SGD4 (hatched portion in FIG. 3) will be mainly described.

The wiring region includes a central wiring portion L1, a plurality of peripheral wiring portions L2 and L3, and a plurality of connecting portions J1 and J2. The central wiring portion L1 and the plurality of peripheral wiring portions L2 and L3 have the same width along the Y direction. In the following description, the central wiring portion L1 and the plurality of peripheral wiring portions L2 and L3 are also simply referred to as wiring portions.

The central wiring portion L1 extends along the X direction over the cell region 100 and is connected to the hookup region 200a. The central wiring portion L1 of the wiring region corresponding to each of the select gate lines SGD0, SGD2, and SGD6 is connected to the hookup region 200a as in the case of the select gate line SGD4. The central wiring portion L1 of the wiring region corresponding to each of the select gate lines SGD1, SGD3, SGD5, and SGD7 is connected to the hookup region 200b.

The plurality of connecting portions J1 are arranged in the X direction at intervals (2 h+d1) on one end side of the central wiring portion L1 in the Y direction (+Y direction side). Each of the plurality of connecting portions J1 has the width d1 along the X direction, and connects between the corresponding peripheral wiring portion L2 and the central wiring portion L1.

The plurality of peripheral wiring portions L2 are arranged along the X direction on one end side of the central wiring portion L1 in the Y direction. The lengths of the plurality of peripheral wiring portions L2 along the X direction are substantially equal to each other. Each of the plurality of peripheral wiring portions L2 is connected to the corresponding connecting portion J1 at the center position along the X direction. That is, each of the plurality of peripheral wiring portions L2 has a first portion connected to the connecting portion J1, a second portion provided on one end side in the X direction (−X direction side) with respect to the first portion, and a third portion provided on the other end side in the X direction (+X direction side) with respect to the first portion.

The plurality of connecting portions J2 are arranged in the X direction at the intervals (2 h+d1) at positions shifted by the length (h+d1) in the X direction from the plurality of connecting portions J1 on the other end side of the central wiring portion L1 in the Y direction (−Y direction side). Each of the plurality of connecting portions J2 has the width d1 along the X direction, and connects between the corresponding peripheral wiring portion L3 and the central wiring portion L1.

The plurality of peripheral wiring portions L3 are arranged along the X direction at positions shifted by the length (h+d1) in the X direction from the plurality of peripheral wiring portions L2 on the other end side of the central wiring portion L1 in the Y direction. The length of each of the plurality of peripheral wiring portions L3 along the X direction is the same as that of the peripheral wiring portions L2. Each of the plurality of peripheral wiring portions L3 is connected to the corresponding connecting portion J2 at the center position along the X direction. That is, each of the plurality of peripheral wiring portions L3 has a first portion connected to the connecting portion J2, a second portion provided on one end side in the X direction (−X direction side) with respect to the first portion, and a third portion provided on the other end side in the X direction (+X direction side) with respect to the first portion.

The wiring region corresponding to the select gate line SGD4 having the above shape is provided between the wiring region corresponding to the select gate line SGD3 and the wiring region corresponding to the select gate line SGD5 in the cell region 100. Specifically, the central wiring portion L1 of the select gate line SGD4 is provided between the peripheral wiring portion L2 of the select gate line SGD5 and the peripheral wiring portion L3 of the select gate line SGD3. The peripheral wiring portion L2 of the select gate line SGD4 is provided so as to be arranged along the X direction between the central wiring portion L1 and the peripheral wiring portions L3 of the select gate line SGD3 via the connecting portions J2 of the select gate line SGD3 and the pillars STP1. The peripheral wiring portion L3 of the select gate line SGD4 is provided so as to be arranged along the X direction between the central wiring portion L1 and the peripheral wiring portions L2 of the select gate line SGD5 via the connecting portions J1 of the select gate line SGD5 and the pillars STP1.

Similarly, the wiring region corresponding to the select gate line SGDk (k is an integer of 1 ☐ k ☐ 6) is provided between the wiring region corresponding to the select gate line SGD (k−1) and the wiring region corresponding to the select gate line SGD (k+1) in the cell region 100.

With such an arrangement, the peripheral wiring portions L2 and L3 of the select gate line SGD are arranged at substantially the same positions in the X direction as the peripheral wiring portions L2 and L3 of the other select gate lines SGD, respectively. Further, the connecting portions J1 and J2 of the select gate line SGD are arranged at substantially the same positions in the X direction as the connecting portions J1 and J2 of the other select gate lines SGD, respectively. Further, the second portion of the peripheral wiring portion L2 of the select gate line SGDk and the third portion of the peripheral wiring portion L3 of the select gate line SGDk are arranged at substantially the same position in the X direction.

The wiring region corresponding to the select gate line SGD0 may be provided between the wiring region corresponding to the select gate line SGD1 and a wiring region corresponding to a select gate line SGD7 of another adjacent block BLK. The wiring region corresponding to the select gate line SGD7 may be provided between the wiring region corresponding to the select gate line SGD6 and a wiring region corresponding to a select gate line SGD0 of another adjacent block BLK. However, the semiconductor memory device according to the embodiment is not limited to these, and for example, a dummy wiring may be provided instead of another block BLK.

With the above configuration, in the cell region 100, the first stacked body is separated into four wiring regions (select gate lines SGD0, SGD2, SGD4, and SGD6) extending from the hookup region 200a side, and the second stacked body is separated into four wiring regions (select gate lines SGD1, SGD3, SGD5, and SGD7) extending from the hookup region 200b side.

Next, the hookup region 200 will be described.

In the hookup region 200, the first stacked bodies and the second stacked bodies are formed in a stepped shape. That is, the stacked wirings in the first stacked bodies and the second stacked bodies extend longer along the X direction as the stacked wirings formed in the lower layer, and each of the stacked wirings has a terrace region in which another stacked wiring is not provided above.

In the hookup region 200a, the plurality of first stacked bodies arranged along the Y direction are separated from each other by the trench structures TST extending along the X direction. The stacked wiring provided in the layer corresponding to the select gate line SGDa in the first stacked body is separated into four select gate lines SGD0, SGD2, SGD4, and SGD6 by the trench structures TST extending along the X direction. The select gate lines SGD0, SGD2, SGD4, and SGD6 are provided with contacts CP0, CP2, CP4, and CP6 on the corresponding terrace regions, respectively.

The word lines WLa0 to WLa7 (partially not shown) are provided with contacts CPWa0 to CPWa7 (partially not shown) on the corresponding terrace regions, respectively.

Also, for the select gate line SGSa, a contact (not shown) is provided on the corresponding terrace region (not shown).

In the hookup region 200b, the plurality of second stacked bodies arranged along the Y direction are separated from each other by the trench structures TST extending along the X direction. The stacked wiring provided in the layer corresponding to the select gate line SGDb in the second stacked body is separated into four select gate lines SGD1, SGD3, SGD5, and SGD7 by the trench structures TST extending along the X direction. The select gate lines SGD1, SGD3, SGD5, and SGD7 are provided with contacts CP1, CP3, CP5, and CP7 on the corresponding terrace regions, respectively.

The word lines WLb0 to WLb7 (partially not shown) are provided with contacts CPWb0 to CPWb7 (partially not shown) on the corresponding terrace regions, respectively.

Also, for the select gate line SGSb, a contact (not shown) is provided on the corresponding terrace region (not shown).

With the above configuration, all the stacked wirings can be pulled out from the hookup region 200 above the memory cell array 10.

1.1.4 Memory Structure

Figure 4:
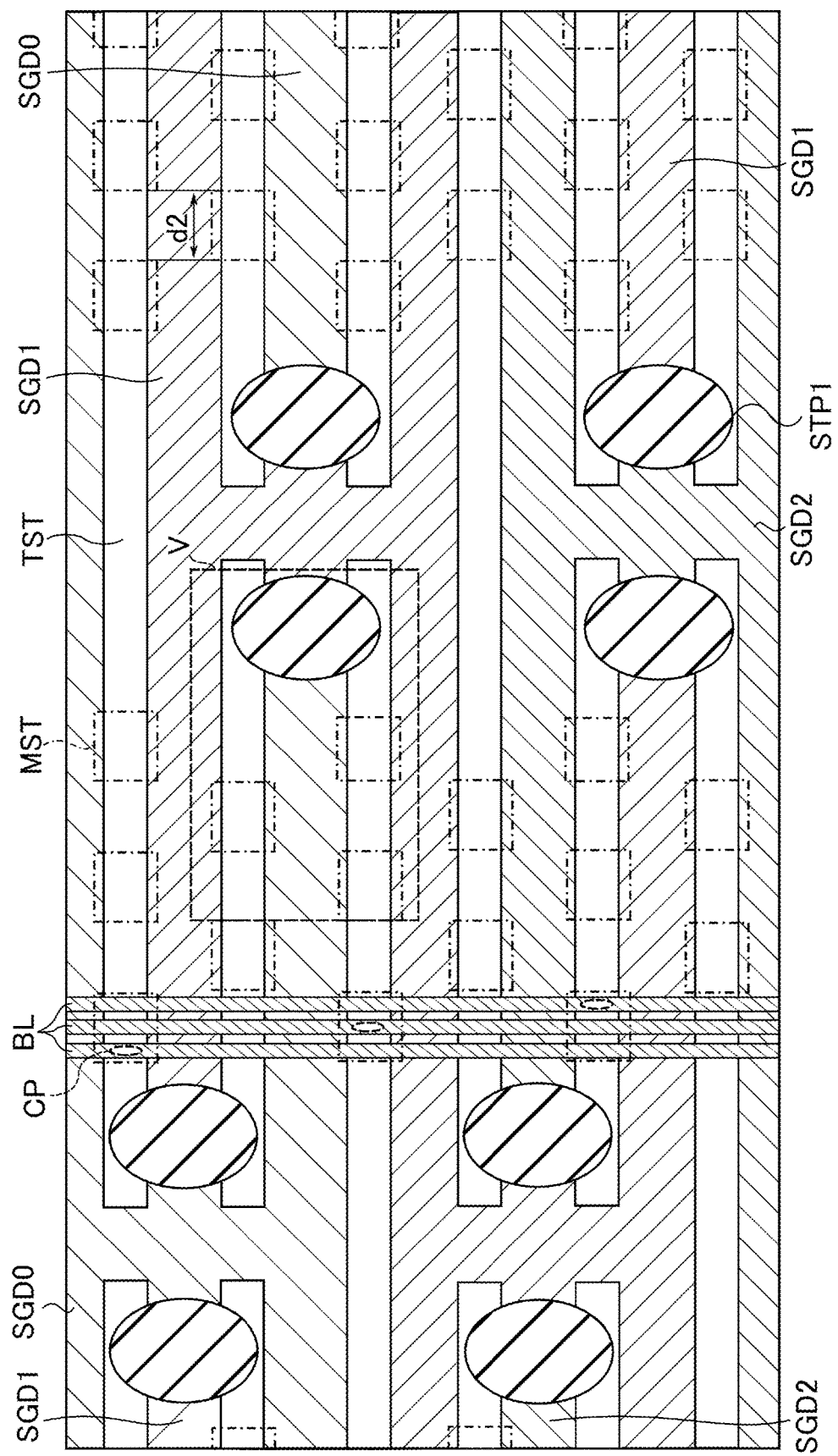
FIG. 4 is a planar layout of the semiconductor memory device corresponding to the region IV of FIG. 3.

Next, the layout of memory structures MST provided in the cell region 100 will be further described with reference to FIG. 4. FIG. 4 is a planar layout of the portion corresponding to the region IV of FIG. 3.

As shown in FIG. 4, in the region where the trench structures TST and the wiring portions L1 to L3 are in contact with each other, a plurality of memory structures MST each provided in an region having the length d2 along the X direction (region surrounded by the alternate long and short dash line in FIG. 4) are provided at the intervals d2. The plurality of memory structures MST are arranged in a staggered pattern on the plurality of trench structures TST. That is, a plurality of memory structures MST included in one of two trench structures TST adjacent to each other along the Y direction are arranged at positions shifted from a plurality of memory structures MST included in the other by the length d2 along the X direction.

Due to the arrangement of the plurality of memory structures MST as described above, three memory structures MST in contact with the peripheral wiring portion L3, the central wiring portion L1, and the peripheral wiring portion L2, respectively, of the same select gate line SGD are arranged in this order along the Y direction at the same position along the X axis.

Above the memory structures MST, the bit lines BL (partially not shown) extending in the Y direction and arranged in the X direction are provided. Then, each of the plurality of bit lines BL is connected to one memory structure MST for each string unit SU by the contact CP (partially not shown).

Specifically, three bit lines BL are provided corresponding to a plurality of memory structures MST arranged along the Y direction at the same position along the X axis. Of the plurality of memory structures MST arranged along the Y direction at the same position along the X axis, the three memory structures MST in contact with the same select gate line SGD are each connected to one bit line BL that is different from each other of the corresponding three bit lines BL. As a result, each of the plurality of bit lines BL is connected to one memory structure MST for each string unit SU.

Figure 5:
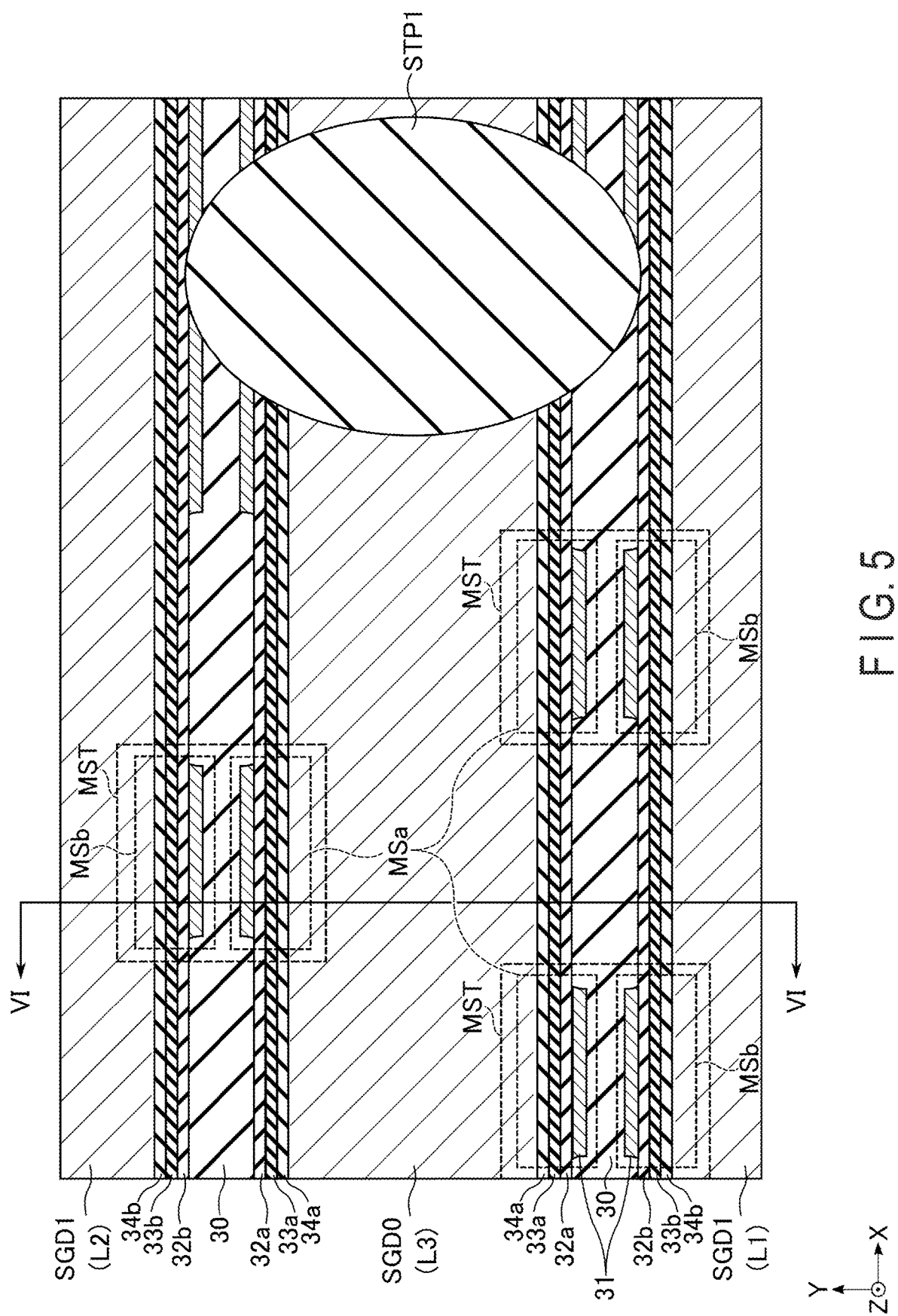
FIG. 5 is a planar layout of the semiconductor memory device corresponding to the region V of FIG. 4.

An example of the memory structure MST of the semiconductor memory device 1 according to the embodiment will be further described below with reference to FIG. 5. FIG. 5 is a plan view corresponding to the region V of FIG. 4. In FIG. 5, components such as the bit lines BL, the contacts CP, and the interlayer insulating films are appropriately omitted in order to make the figure easier to see.

FIG. 5 shows a configuration including two trench structures TST, three memory structures MST arranged in a staggered pattern in each of the two trench structures TST, the pillar STP1, and the select gate lines SGDO and SGD1.

As shown in FIG. 5, one of the two trench structures TST (trench structure TST on the +Y direction side) is provided between the peripheral wiring portion L2 (SGD1 (L2) in FIG. 5) of the select gate line SGD1 and the peripheral wiring portion L3 (SGDO (L3) in FIG. 5) of the select gate line SGD0.

The one trench structure TST includes a tunnel insulating film 32b, a charge storage film 33b, and a block insulating film 34b on the peripheral wiring portion L2 side of the select gate line SGD1, a tunnel insulating film 32a, a charge storage film 33a, and a block insulating film 34a on the peripheral wiring portion L3 side of the select gate line SGDO, and a core member 30 in the center of the one trench structure TST. The core member 30, the tunnel insulating films 32a and 32b, the charge storage films 33a and 33b, and the block insulating films 34a and 34b extend along the X direction over the entire one trench structure TST.

The other of the two trench structures TST (trench structure TST on the −Y direction side) is provided between the peripheral wiring portion L3 of the select gate line SGD0 and the central wiring portion L1 of the select gate line SGD1 (SGD1 (L1) in FIG. 5) arranged along the Y direction.

The other trench structure TST includes a tunnel insulating film 32a, a charge storage film 33a, and a block insulating film 34a on the peripheral wiring portion L3 side of the select gate line SGD0, a tunnel insulating film 32b, a charge storage film 33b, and a block insulating film 34b on the central wiring portion L1 side of the select gate line SGD1, and a core member 30 in the center of the other trench structure TST. The core member 30, the tunnel insulating films 32a and 32b, the charge storage films 33a and 33b, and the block insulating films 34a and 34b extend along the X direction over the entire other trench structure TST.

Also, each of the two trench structures TST includes a semiconductor 31. The semiconductor 31 includes a plurality of first portions provided between the tunnel insulating film 32a and the core member 30, a plurality of second portions provided between the tunnel insulating film 32b and the core member 30, and a third portion (not shown) located below the core member 30. The first portion of the semiconductor 31 and the second portion of the semiconductor 31 corresponding to each other are commonly connected by the third portion of the semiconductor 31, are formed at substantially the same position along the X direction, and have a length less than the length d2 along the X direction.

The memory structure MST is formed in a part including, in the order along the Y direction, the block insulating film 34a, the charge storage film 33a, the tunnel insulating film 32a, the first portion of the semiconductor 31, the core member 30, the second portion of the semiconductor 31, the tunnel insulation film 32b, the charge storage film 33b, and the block insulating film 34b, in the trench structure TST described above.

In the memory structure MST, the select gate line SGD0 side with respect to the core member 30 functions as the memory string MSa and the select gate line SGD1 side with respect to the core member 30 functions as the memory string MSb. That is, the memory structure MST included in each of the two trench structures TST has a part that functions as the memory string MSa and a part that functions as the memory string MSb.

Figure 6:
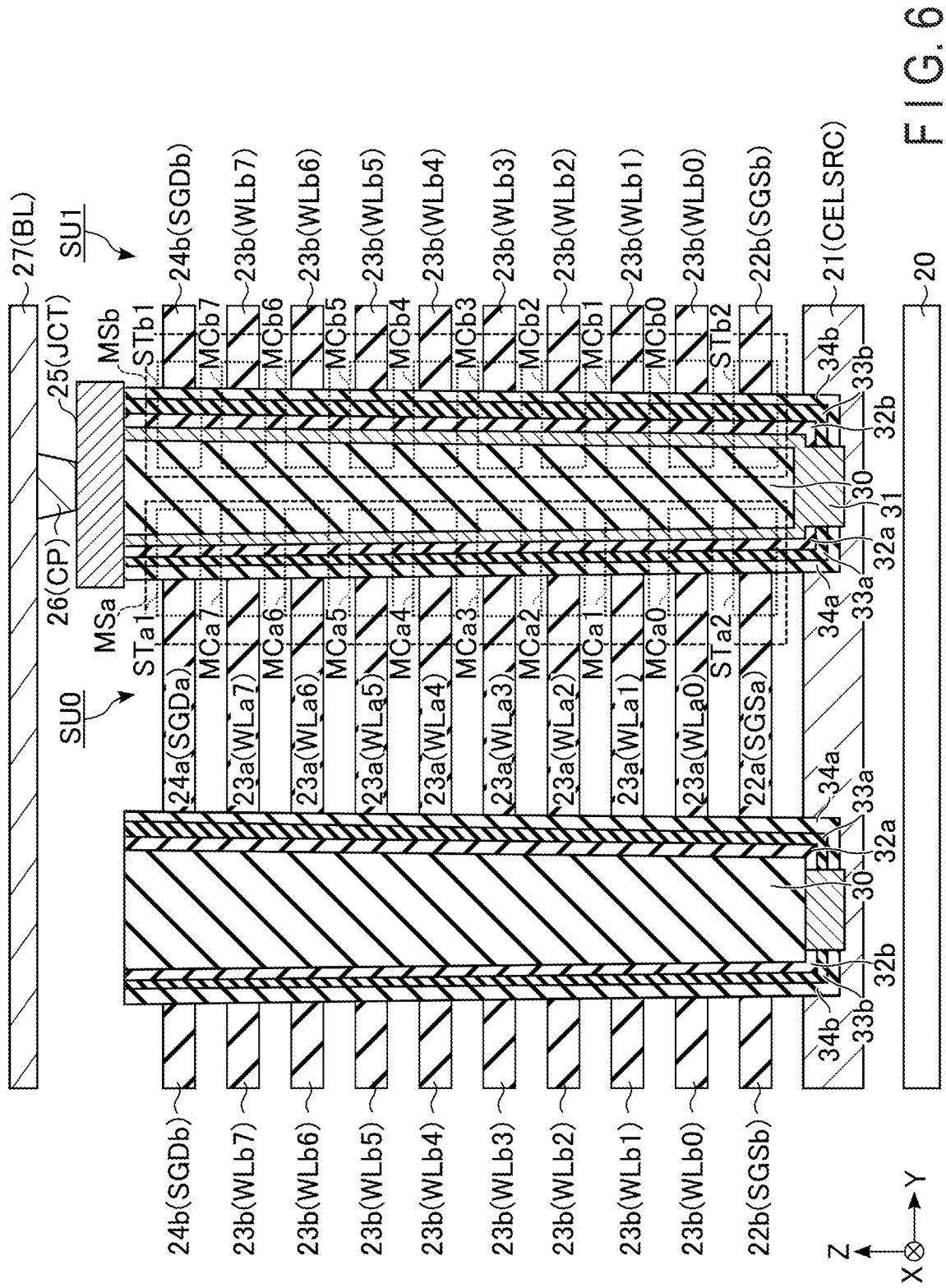
FIG. 6 is a vertical cross-sectional view of the semiconductor memory device taken along the line VI-VI of FIG. 5.

Next, with reference to FIG. 6, the configuration of the cross section of the memory structure MST along the YZ plane will be described. FIG. 6 is a cross-sectional view of the semiconductor memory device taken along the line VI-VI of FIG. 5. FIG. 6 shows a configuration including the memory structure MST in one trench structure TST of the two trench structures TST adjacent to each other in the Y direction, a part where the memory structure MST in the other trench structure TST is not formed, and a plurality of conductors that function as various wirings connected to the memory structure MST.

As shown in FIG. 6, a conductor 21 that functions as a source line CELSRC is provided above the semiconductor substrate 20. The conductor 21 is made of a conductive material, and for example, an n-type semiconductor to which impurities have been added or a metal material is used. Further, for example, the conductor 21 may have a stacked structure of a semiconductor and a metal. Circuits such as the row decoder module 15 and the sense amplifier module 16 may be provided between the semiconductor substrate 20 and the conductor 21.

Above the conductor 21, a conductor 22a that functions as the select gate line SGSa and a conductor 22b that functions as the select gate line SGSb provided on the same layer are stacked along the Z direction via an insulator (not shown). Above the conductor 22a, eight layers of conductors 23a that function as the word lines WLa0 to WLa7 are stacked along the Z direction via insulators (not shown) between the layers. Similarly, above the conductor 22b, eight layers of conductors 23b that function as the word lines WLb0 to WLb7 are stacked along the Z direction via insulators (not shown) between the layers. Above the conductors 23a and 23b, a conductor 24a that functions as the select gate line SGD0 and a conductor 24b that functions as the select gate line SGD1 are stacked, respectively, along the Z direction via insulators (not shown).

The conductors 22a to 24a and 22b to 24b are made of a conductive material, and for example, an n-type semiconductor or a p-type semiconductor to which impurities have been added, or a metal material is used. For example, as the conductors 22a to 24a and 22b to 24b, a structure in which tungsten (W) is covered with titanium nitride (TiN) is used. For example, when tungsten is formed by CVD (chemical vapor deposition), titanium nitride functions as a barrier layer for preventing the reaction between tungsten and silicon oxide ($SiO_2$) or a layer for improving the adhesion of tungsten. Further, in the conductors 22a to 24a and 22b to 24b, the above-mentioned conductive material may be further covered with aluminum oxide (AlO).

Conductors 27 are provided above the conductors 24a and 24b via insulators (not shown). The conductors 27 are each stretched along the Y direction, a plurality of the conductors 27 are arranged in a line along the X direction, and each of them is used as the bit line BL. The conductors 27 contain, for example, copper (Cu).

The core member 30 extends along the Z direction with the upper end included in the layers above the conductors 24a and 24b and the lower end included in the layers below the conductors 22a and 22b. The core member 30 contains, for example, silicon oxide ($SiO_2$).

In the memory structure MST in the trench structure TST, the first portion of the semiconductor 31 covers one of the two side surfaces of the core member 30 along the XZ plane, and the second portion of the semiconductor 31 covers the other of the two side surfaces of the core member 30 along the XZ plane. The third portion of the semiconductor 31 covers the lower surface of the core member 30 and is in contact with the lower end of the first portion of the semiconductor 31, the lower end of the second portion of the semiconductor 31, and the conductor 21. The upper ends of the first portion and the second portion of the semiconductor 31 reach the same position as the upper end of the core member 30. The semiconductor 31 contains, for example, polysilicon.

In the memory structure MST in the trench structure TST, the tunnel insulating film 32a covers one of the two side surfaces of the semiconductor 31 along the XZ plane, and the tunnel insulating film 32b covers the other of the two side surfaces of the semiconductor 31 along the XZ plane.

In the region in the trench structure TST where the memory structure MST is not formed, the tunnel insulating film 32a covers one of the two side surfaces of the core member 30 along the XZ plane, and the tunnel insulating film 32b covers the other of the two side surfaces of the core member 30 along the XZ plane. The upper ends of the tunnel insulating films 32a and 32b reach the same position as the upper ends of the core member 30 and the semiconductor 31, and contain, for example, silicon oxide ($SiO_2$).

The charge storage film 33a covers the side surface of the tunnel insulating film 32a along the XZ plane, and the charge storage film 33b covers the side surface of the tunnel insulating film 32b along the XZ plane. The upper ends of the charge storage films 33a and 33b reach the same position as the upper ends of the core member 30 and the semiconductor 31.

The block insulating film 34a covers the side surface of the charge storage film 33a along the XZ plane, and the block insulating film 34b covers the side surface of the charge storage film 33b along the XZ plane. The upper ends of the block insulating films 34a and 34b reach the same position as the upper ends of the core member 30 and the semiconductor 31. The block insulating film 34a is in contact with each of the conductors 22a to 24a. The block insulating film 34b is in contact with each of the conductors 22b to 24b.

The charge storage films 33a and 33b contain, for example, silicon nitride (SiN). The block insulating films 34a and 34b contain, for example, silicon oxide ($SiO_2$).

The semiconductor 25 contains, for example, polysilicon and covers the upper surface of the core member 30, the upper surface of the semiconductor 31, and the upper surfaces of the tunnel insulating films 32a and 32b. Thereby, the semiconductor 31 can form two parallel current paths arranged along the Y axis via the core member 30 between the semiconductor 25 and the conductor 21. That is, the semiconductor 25 functions as a joint portion JCT of the current paths.

Conductors 26 that each function as a columnar contact CP are provided on the upper surface of the semiconductor 25. One corresponding conductor 27 is in contact with the upper surface of each of the conductors 26 and is electrically connected thereto.

In the memory structure MST described above, the portion where the memory structure MST and the conductor 22a intersect functions as the select transistor STa2, and the portion where the memory structure MST and the conductor 22b intersect functions as the select transistor STb2. The portion where the memory structure MST and the conductor 23a intersect functions as the memory cell transistor MCa, and the portion where the memory structure MST and the conductor 23b intersect functions as the memory cell transistor MCb. The portion where the memory structure MST and the conductor 24a intersect functions as the select transistor STa1, and the portion where the memory structure MST and the conductor 24b intersect functions as the select transistor STb1.

That is, the semiconductor 31 is used as channel and well regions of each of the select transistors STa1 and STb1, the memory cell transistors MCa and MCb, and the select transistors STa2 and STb2. The charge storage film 33a is used as a charge storage layer of the memory cell transistor MCa, and the charge storage film 33b is used as a charge storage layer of the memory cell transistor MCb. Thereby, the memory structure MST functions as, for example, a pair of two memory strings MSa and MSb.

The structure of the memory structure MST described above is merely an example, and the memory structure MST may have other structures. For example, the number of conductors 23 is based on the number of word lines WL that can be designed to any number. Any number of conductors 22 and 24 may be assigned to the select gate lines SGS and SGD, respectively. When a plurality of layers of conductors 22 are assigned to the select gate line SGS, different conductors may be used for each of the plurality of layers of conductors 22. Any number of conductors that function as dummy word lines (not shown) may be provided between the word line WL at the bottom layer and the select gate line SGS and between the word line WL at the top layer and the select gate line SGD. The semiconductor 25 and the conductor 27 may be electrically connected via two or more contacts, or may be electrically connected via another wiring.

1.2 Manufacturing Method for Semiconductor Memory Device

An example of manufacturing step of the memory cell array in the semiconductor memory device according to the embodiment will be described below. FIGS. 7 to 12 and FIGS. 14 to 23 each show an example of a cross-sectional structure including a structure corresponding to the memory cell array in a manufacturing step of the semiconductor memory device according to the embodiment, and FIG. 13 shows an example of a planar structure including the structure corresponding to the memory cell array in a manufacturing step of the semiconductor memory device according to the embodiment. The region shown in the cross-sectional view of each of the manufacturing steps shown in FIGS. 7, 8, 10, 11, 14, 15, 17, 19, and 22 corresponds to the region shown in FIG. 6. Further, the cross-sectional view of the manufacturing step shown in FIG. 9 corresponds to the region of FIG. 5 in the cross-sectional view taken along the line IX-IX of FIG. 8, and FIGS. 12, 16, 18, 21, and 23 correspond to the region shown in FIG. 9. The plan view of the manufacturing step shown in FIG. 13 corresponds to the region of FIG. 5. Further, the cross-sectional view of the manufacturing step shown in FIG. 20 corresponds to the region of FIG. 5 in the cross-sectional view taken along the line XX-XX of FIG. 19.

Figure 7:
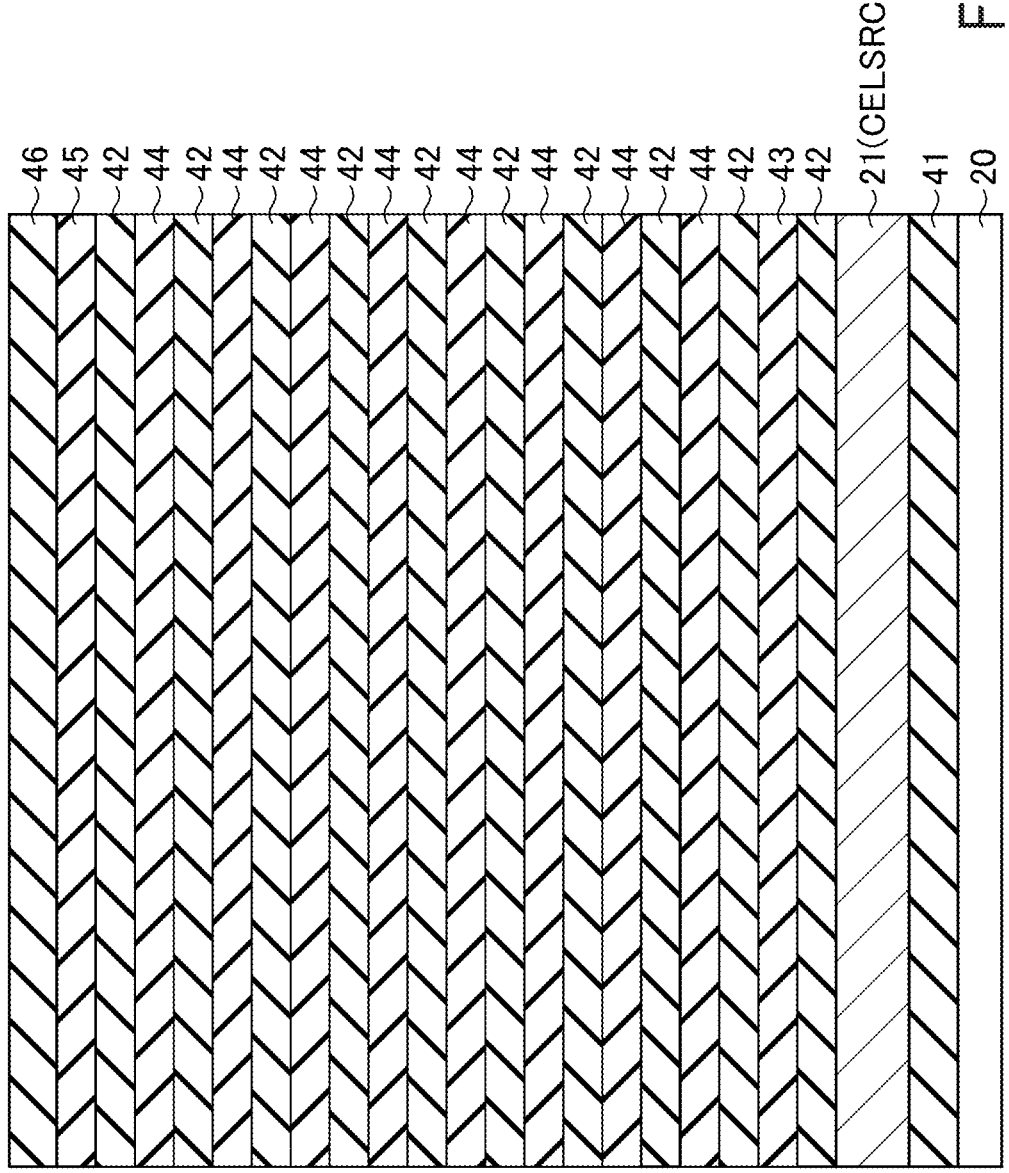
FIG. 7 is a vertical cross-sectional view of the memory cell array for explaining a manufacturing step of the semiconductor memory device of the embodiment.

First, as shown in FIG. 7, a sacrificial member 43, eight layers of sacrificial members 44, and a sacrificial member 45 respectively corresponding to the select gate line SGS, the word lines WL0 to WL7, and the select gate line SGD are stacked. Specifically, first, an insulator 41 and the conductor 21 are stacked in this order on the semiconductor substrate 20. An insulator 42 and the sacrificial member 43 are stacked in this order on the conductor 21. An insulator 42 and the sacrificial member 44 are alternately stacked a plurality of times (8 times in the example of FIG. 7) on the sacrificial member 43. An insulator 42 and the sacrificial member 45 are stacked in this order on the sacrificial member 44. Then, an insulator 46 is further stacked on the sacrificial member 45.

The insulators 41, 42, and 46 contain, for example, silicon oxide, and the sacrificial members 43, 44, and 45 contain, for example, silicon nitride. The numbers of layers of the sacrificial members 43, 44, and 45 to be formed correspond to the numbers of select gate lines SGS, word lines WL, and select gate lines SGD to be stacked, respectively.

Figure 8:
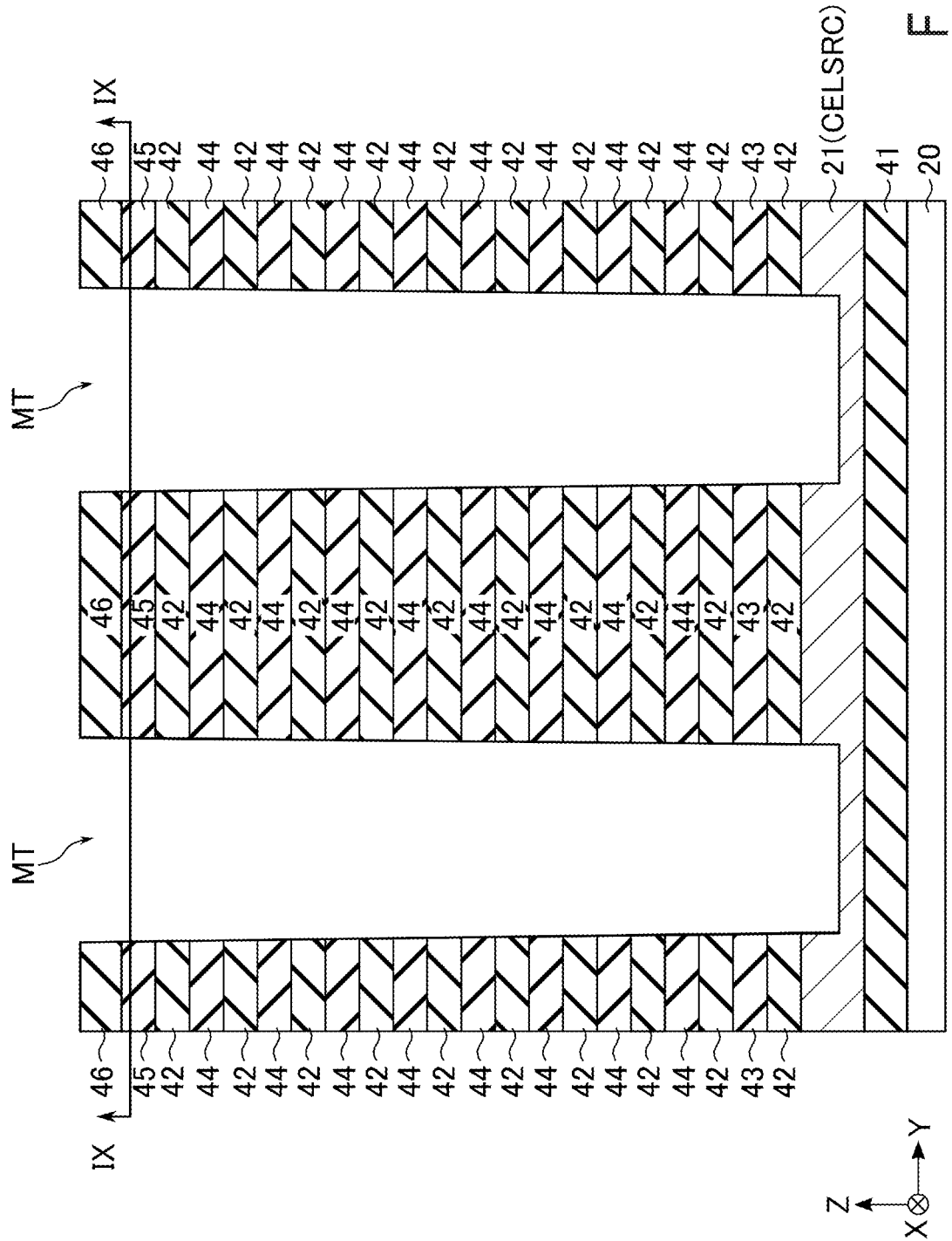
FIG. 8 is a vertical cross-sectional view of the memory cell array for explaining a manufacturing step of the semiconductor memory device of the embodiment.

Next, as shown in FIG. 8, the regions where the trench structures TST are to be formed are removed from the stacked body formed by the process shown in FIG. 7, and trenches MT are formed. Specifically, first, a mask in which the regions corresponding to the trench structures TST are open is formed by lithography. Then, the trenches MT are formed by anisotropic etching using the formed mask. The lower end of the trench MT reaches, for example, the conductor 21. The anisotropic etching in this step is, for example, RIE (Reactive Ion Etching).

Figure 9:
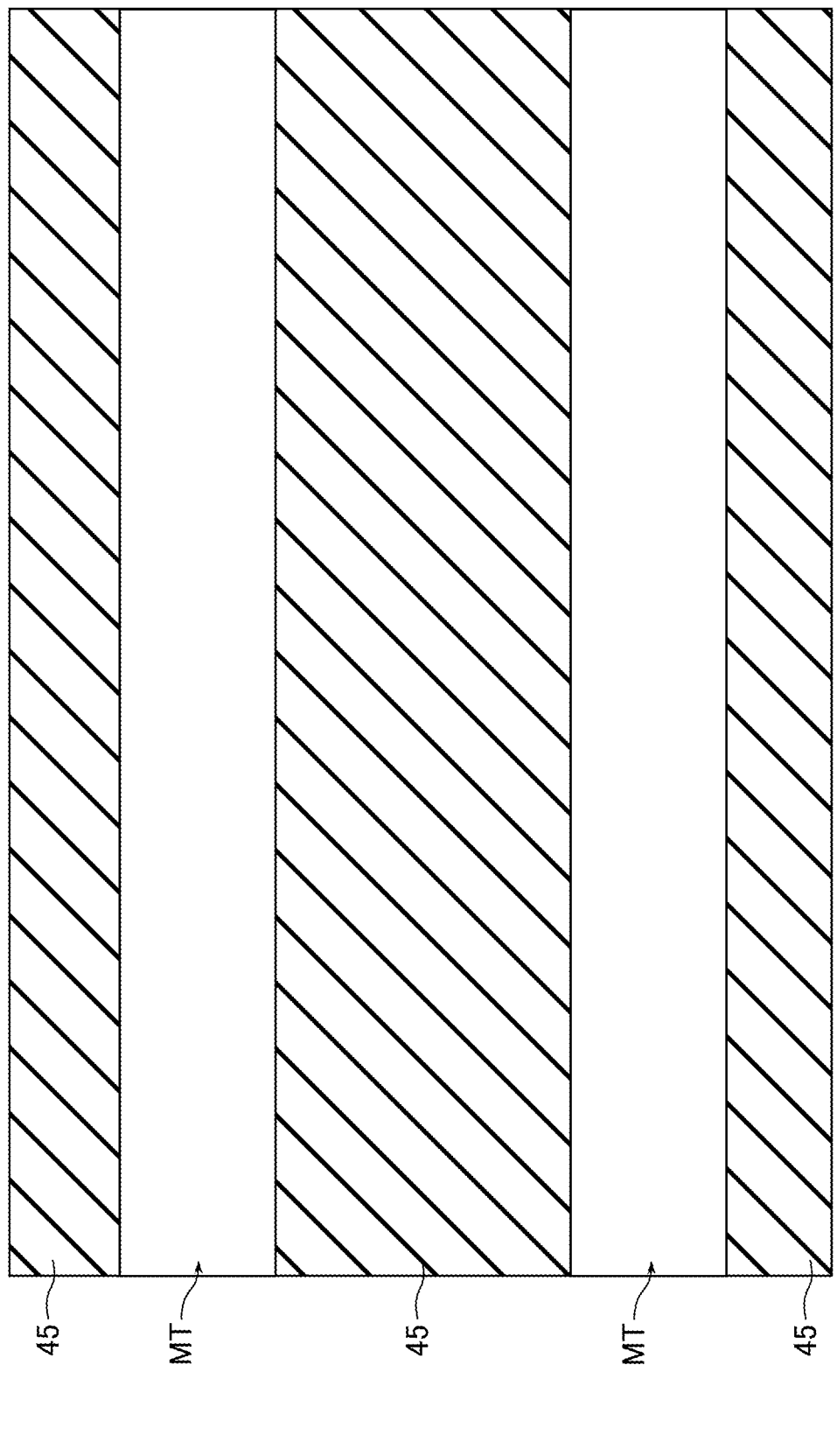
FIG. 9 is a transverse cross-sectional view of the memory cell array taken along the line IX-IX of FIG. 8.

FIG. 9 shows a cross-sectional view taken along the line IX-IX of FIG. 8. As shown in FIG. 9, by this step, the line-shaped trenches MT and portions of the stacked body including the sacrificial members 45 that sandwich the trenches MT in the Y direction are formed. As shown in FIG. 3, since the stacked wiring has a shape extending longer along the X direction than the trench structures TST, the portions of the stacked body including the sacrificial members 45 are not separated by the trenches MT.

Figure 10:
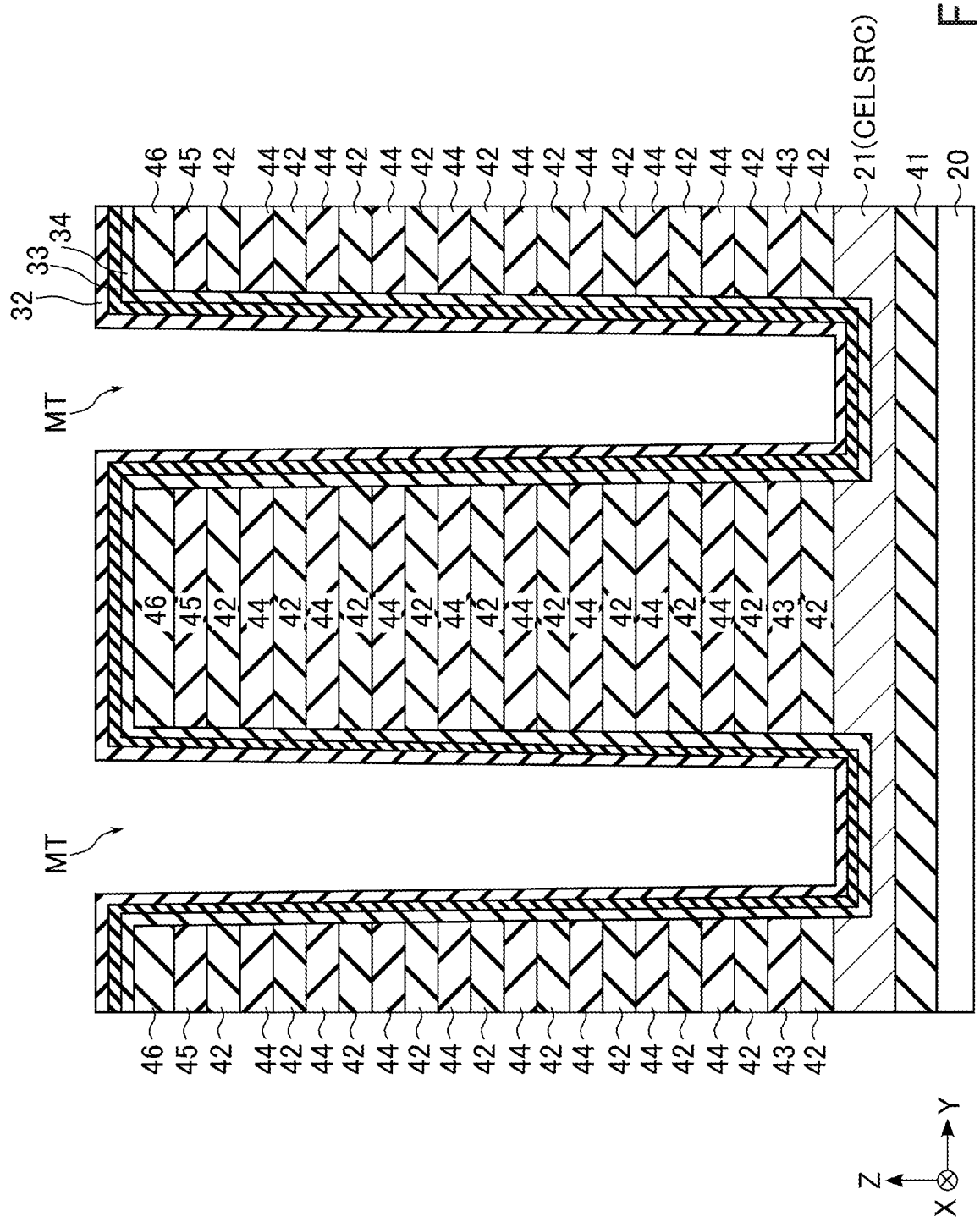
FIG. 10 is a vertical cross-sectional view of the memory cell array for explaining a manufacturing step of the semiconductor memory device of the embodiment.

Next, as shown in FIG. 10, a block insulating film 34, a charge storage film 33, and a tunnel insulating film 32 are formed over the entire surface including the insides of the trenches MT.

Figure 11:
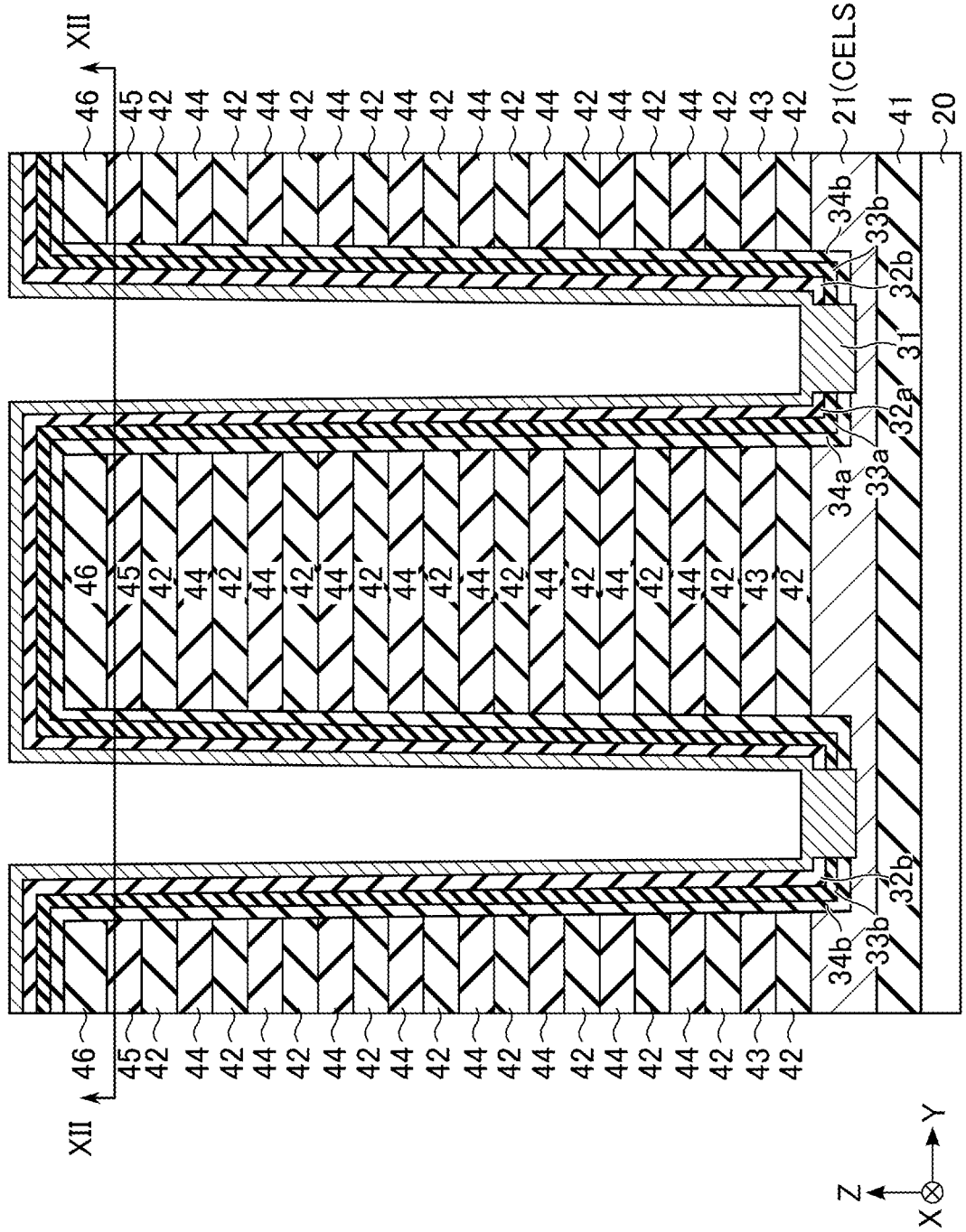
FIG. 11 is a vertical cross-sectional view of the memory cell array for explaining a manufacturing step of the semiconductor memory device of the embodiment.

Next, as shown in FIG. 11, the semiconductor 31 is further formed. Specifically, the block insulating film 34, the charge storage film 33, and the tunnel insulating film 32 formed at the lower ends of the trenches MT are removed, and the conductor 21 is exposed. As a result, the block insulating film 34 is separated into the block insulating film 34a and the block insulating film 34b surrounded by the insulators 42 and 46, and the sacrificial members 43, 44, and 45. Further, the charge storage film 33 is separated into the charge storage film 33a in contact with the block insulating film 34a and the charge storage film 33b in contact with the block insulating film 34b. Further, the tunnel insulating film 32 is separated into the tunnel insulating film 32a in contact with the charge storage film 33a and the tunnel insulating film 32b in contact with the charge storage film 33b. The etching in this step is, for example, RIE.

Subsequently, the semiconductors 31 are formed in the trenches MT. As a result, the semiconductor 31 is held in contact with the conductor 21 while having a portion that sandwiches the charge storage film 33a and the tunnel insulating film 32a with the block insulating film 34a on one of the two XZ planes in the trench MT, and a portion that sandwiches the charge storage film 33b and the tunnel insulating film 32b with the block insulating film 34b on the other XZ plane.

Figure 12:
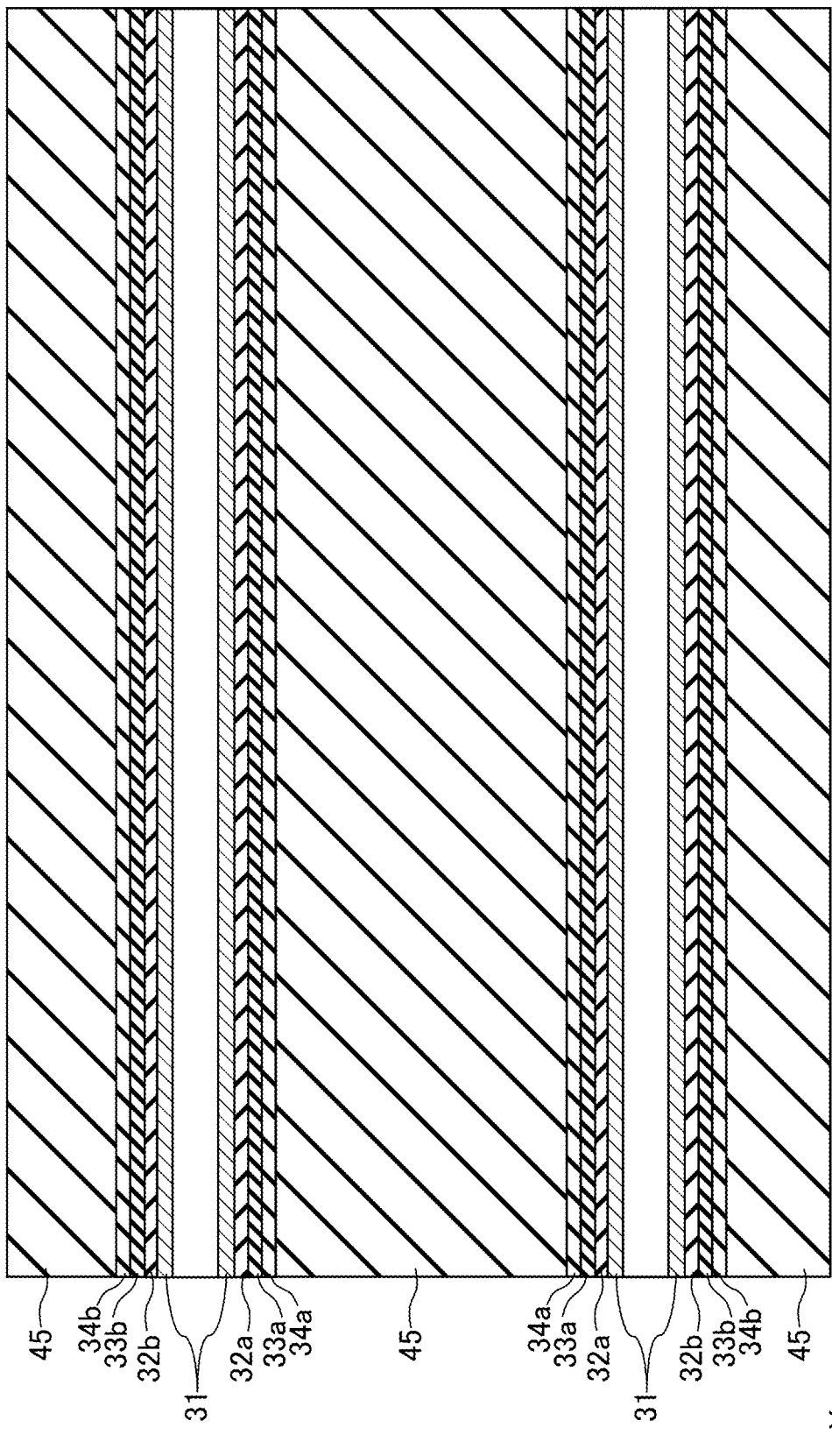
FIG. 12 is a transverse cross-sectional view of the memory cell array taken along the line XII-XII of FIG. 11.
Figure 13:
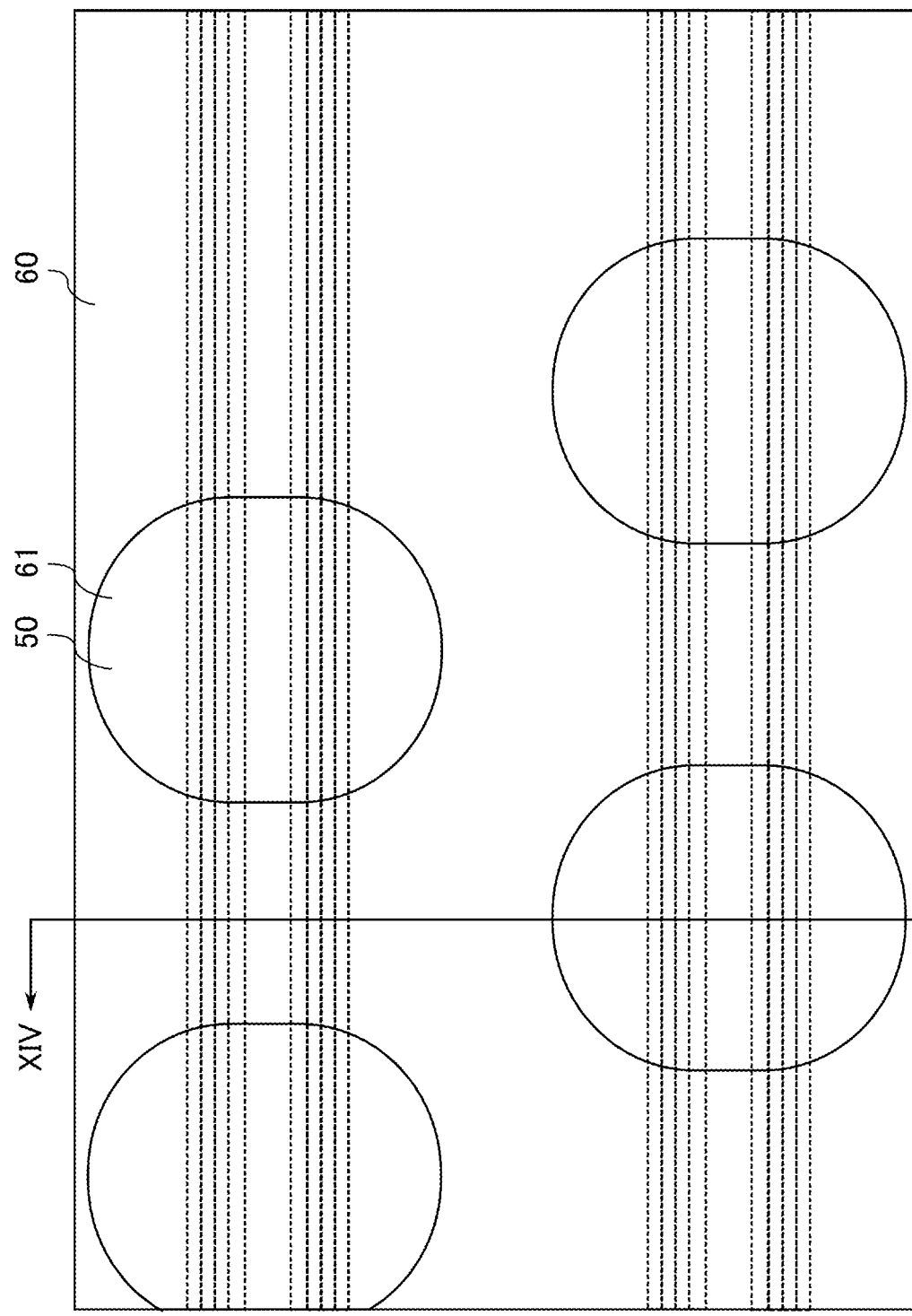
FIG. 13 is a transverse cross-sectional view of the memory cell array for explaining a manufacturing step of the semiconductor memory device of the embodiment.

FIG. 12 shows a cross-sectional view taken along the line XII-XII of FIG. 11. As shown in FIG. 12, by this step, the block insulating film 34a (34b), the charge storage film 33a (33b), the tunnel insulating film 32a (32b), and the semiconductor 31 are formed in this order along the Y axis at each of two portions of the space between the sacrificial members 45 on one sacrificial member 45 side and the other sacrificial member 45 side.

Subsequently, as shown in FIG. 13, after a protective material 50 is formed over the entire surface including the insides of the trenches MT, a mask 60 in which regions 61 that sandwich the regions where the memory structures MST are to be formed in the X direction are opened is formed on the protective material 50. In FIG. 13, the cross-sectional structure of the layer where the sacrificial member 45 is provided below the protective material 50 is shown by the dotted lines.

Specifically, first, the protective material 50 is embedded in the trenches MT, and the entire surface including the trenches MT is covered with the film of the protective material 50. The film of the protective material 50 is a spin-on carbon (SOC) film or the like. Then, on the film of the protective material 50, the mask 60 in which the regions 61 where the memory structures MST are not to be formed in the structures formed in the trenches MT are opened in a staggered pattern is formed. As the mask 60, for example, tetraethoxysilane (TEOS) is used.

FIG. 14 shows a cross-sectional view taken along the line XIV-XIV of FIG. 13. As shown in FIG. 14, by this step, the regions where the memory structures MST are to be formed are protected, and the mask 60 in which the regions 61 that sandwich the regions in the X direction are opened is formed.

Figure 15:
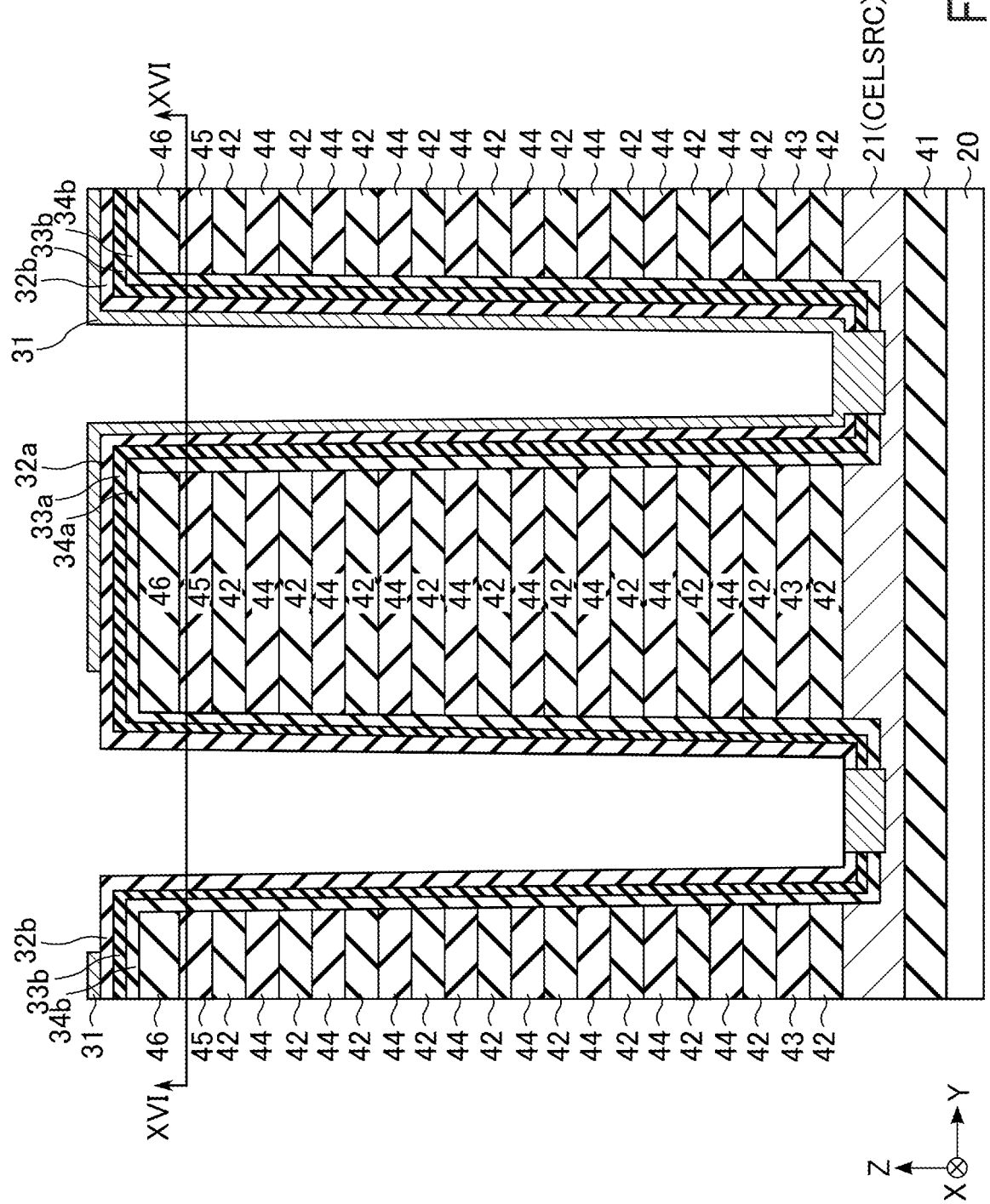
FIG. 15 is a vertical cross-sectional view of the memory cell array for explaining a manufacturing step of the semiconductor memory device of the embodiment.

Next, as shown in FIG. 15, the semiconductor 31 in the regions where the memory structures MST in the trenches MT are to be formed is left unremoved, whereas the semiconductor 31 in the open regions 61 of the mask 60 is selectively removed. Specifically, the protective material 50 is removed in the open regions 61 of the mask 60 by anisotropic etching using the mask 60. The anisotropic etching in this step is, for example, RIE. By this step, in the open region 61 of the mask 60, a space surrounded by the two XZ planes in which the semiconductor 31 in the trench MT is exposed and the two YZ planes formed by the protective material 50 embedded in the trench MT is formed.

Subsequently, in the space, the semiconductor 31 in the exposed two XZ planes is selectively removed by isotropic etching using the two YZ planes formed by the protective material 50 as a mask. The isotropic etching in this step is, for example, wet etching or dry etching. After the selective removal of the exposed semiconductor 31, the protective material 50 and the mask 60 are removed by ashing or the like.

FIG. 16 shows a cross-sectional view taken along the line XVI-XVI of FIG. 15. As shown in FIG. 16, by this step, the semiconductor 31 in the portions in the trenches MT corresponding to the open regions 61 of the mask 60 is selectively removed, and the semiconductor 31 in the regions where the memory structures MST are to be formed (the regions surrounded by the dotted lines in FIG. 16) remains in the trenches MT.

Figure 17:
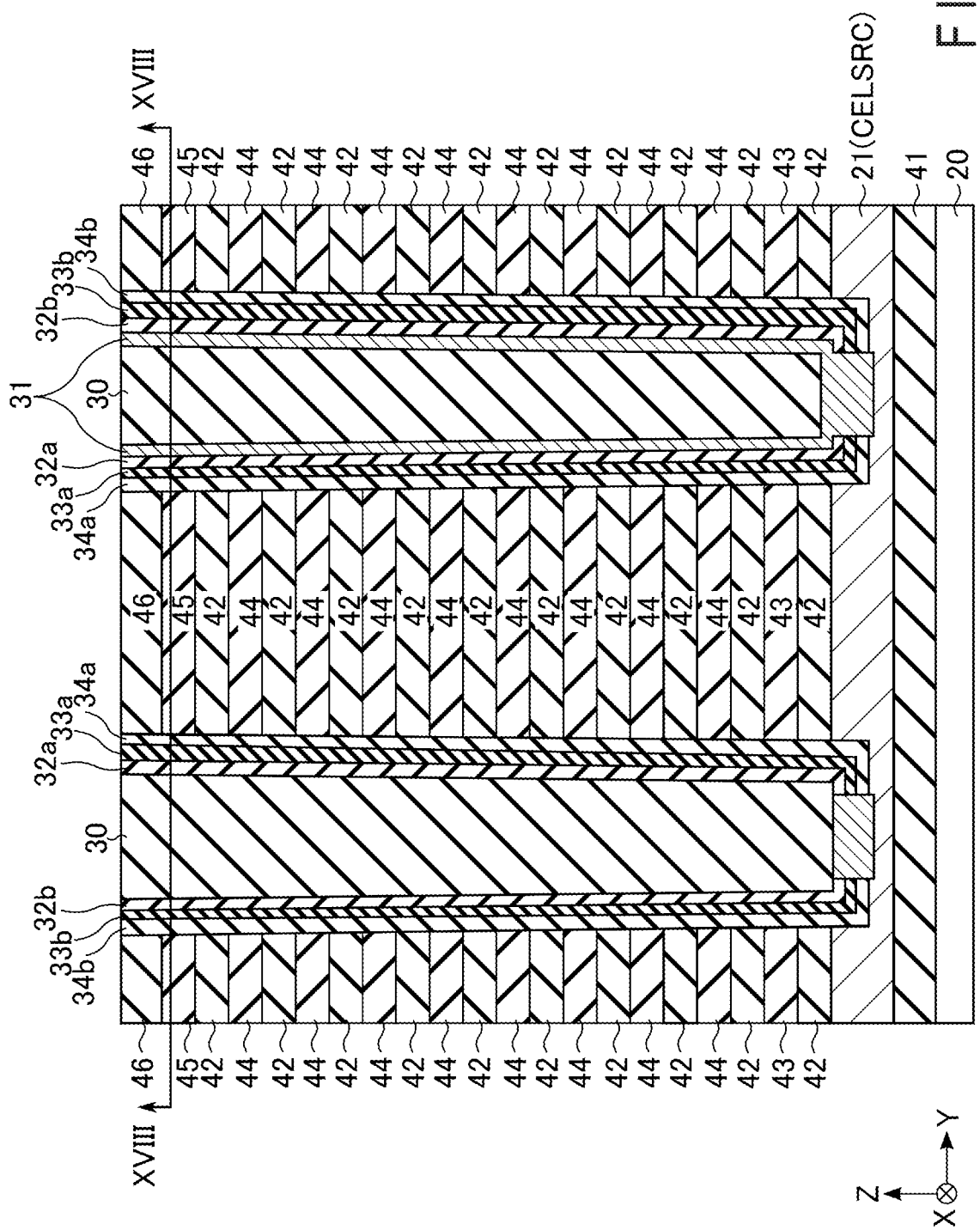
FIG. 17 is a vertical cross-sectional view of the memory cell array for explaining a manufacturing step of the semiconductor memory device of the embodiment.

Subsequently, as shown in FIG. 17, after the core members 30 are formed and the trenches MT are embedded, the structure is flattened by CMP (Chemical Mechanical Polishing) or the like, so that the portion above the insulator 46 is removed.

Figure 18:
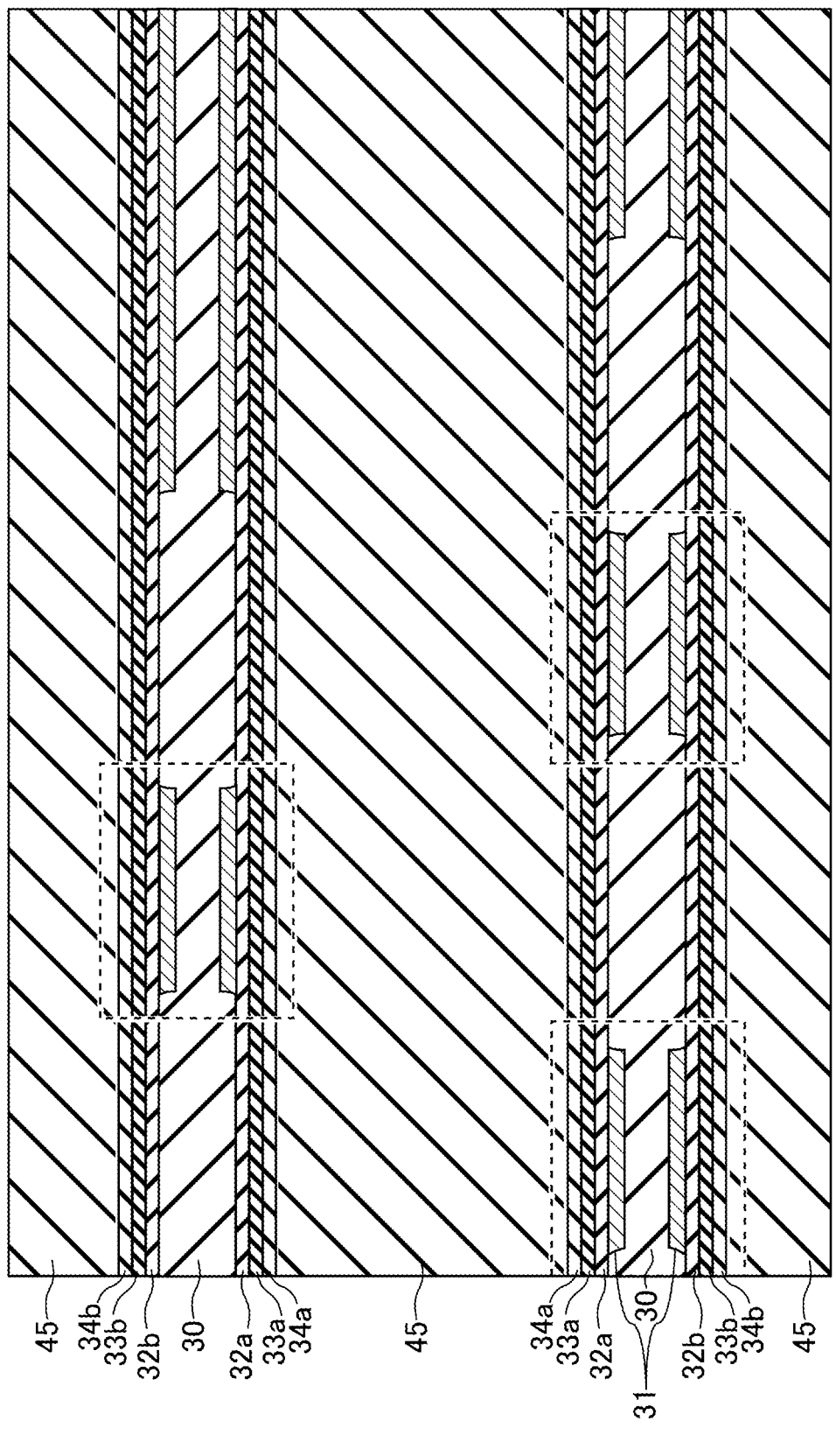
FIG. 18 is a transverse cross-sectional view of the memory cell array taken along the line XVIII-XVIII of FIG. 17.

FIG. 18 shows a cross-sectional view taken along the line XVIII-XVIII of FIG. 17. As shown in FIG. 18, by this step, in the region where the memory structure MST is to be formed (the region surrounded by the dotted line in FIG. 18), in the space between the sacrificial members 45, along the Y axis, the block insulating film 34a, the charge storage film 33a, the tunnel insulating film 32a, the semiconductor 31, the core member 30, the semiconductor 31, the tunnel insulating film 32b, the charge storage film 33b, and the block insulating film 34b are formed in this order.

Figure 19:
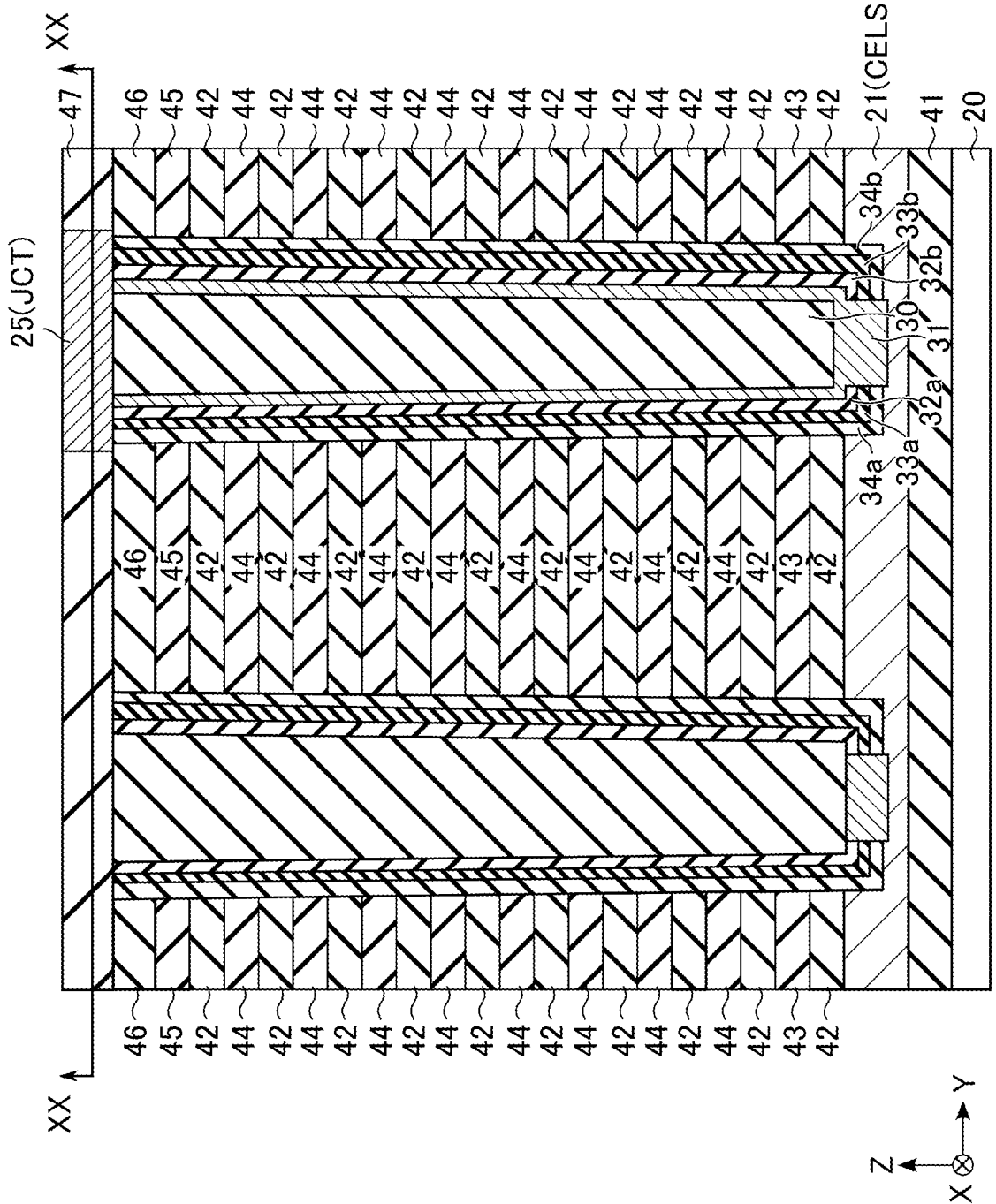
FIG. 19 is a vertical cross-sectional view of the memory cell array for explaining a manufacturing step of the semiconductor memory device of the embodiment.

Next, as shown in FIG. 19, the semiconductor 25 is formed on the upper surface of the structure in which the trench MT is embedded in the region where the memory structure MST is to be formed. Specifically, first, an insulator 47 is formed over the entire surface, and then a mask in which regions corresponding to the semiconductors 25 are opened is formed by lithography. Then, by anisotropic etching using the formed mask, holes are formed in the regions where the semiconductors 25 are to be formed, and the semiconductors 31 are exposed. By embedding the semiconductors 25 in the holes, the semiconductors 31 are electrically connected to the semiconductors 25.

Figure 20:
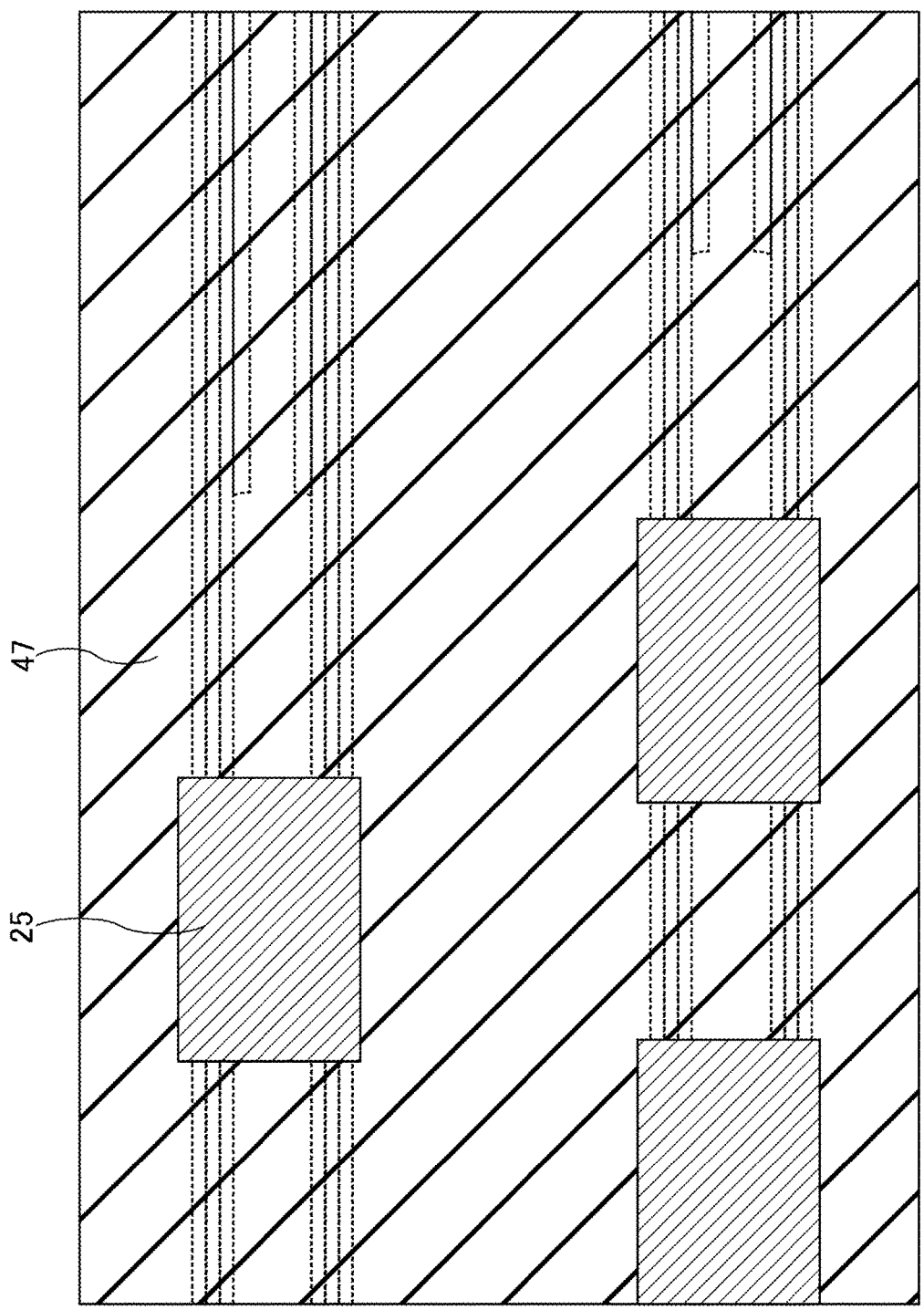
FIG. 20 is a transverse cross-sectional view of the memory cell array taken along the line XX-XX of FIG. 19.

FIG. 20 shows a cross-sectional view taken along the line XX-XX of FIG. 19. In FIG. 20, the cross-sectional structures of the layers where the sacrificial members 45 are provided below the semiconductors 25 are shown by the broken lines. As shown in FIG. 20, by this step, in the region where the memory structure MST is to be formed, the first portion of the semiconductor 31 and the second portion of the semiconductor 31 are covered by one semiconductor 25. As a result, the first portion of the semiconductor 31 and the second portion of the semiconductor 31 are connected in parallel between the semiconductor 25 and the conductor 21.

Figure 21:
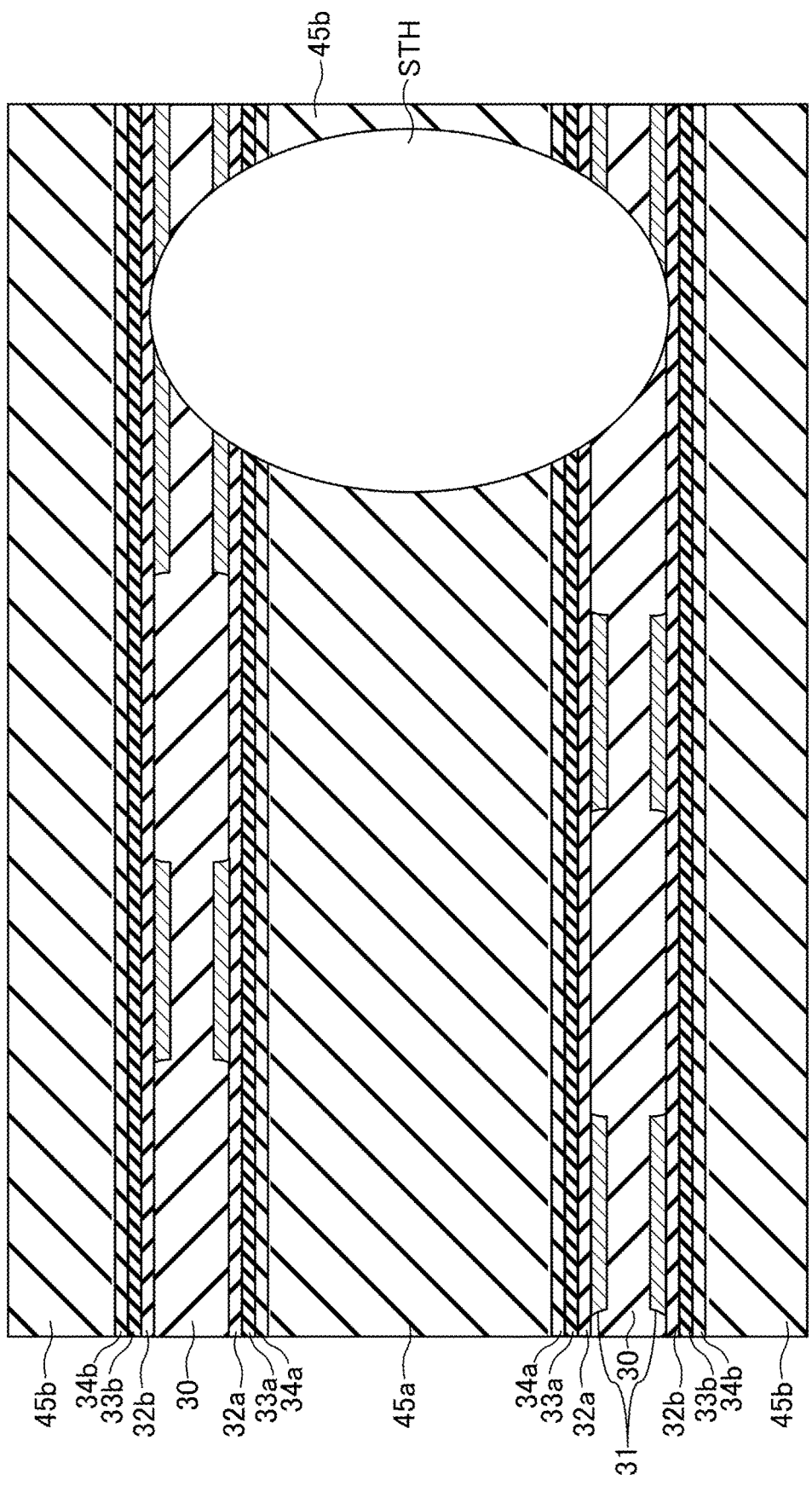
FIG. 21 is a transverse cross-sectional view of the memory cell array for explaining a manufacturing step of the semiconductor memory device of the embodiment.

Next, as shown in FIG. 21, a hole STH is formed in the region where the pillar STP1 is to be formed so as to separate the portion sandwiched between the structures in which the two trenches MT adjacent in the Y direction are embedded along the X direction. The hole STH separates the sacrificial member 45 into two portions 45a and 45b. In addition, the sacrificial members 45a and 45b are exposed in the hole STH.

Although not shown in FIG. 21, similarly to the sacrificial member 45, the sacrificial members 43 and 44 are separated into two portions 43a and 43b and two portions 44a and 44b, respectively. Also, similarly to the sacrificial members 45a and 45b, the sacrificial members 43a and 43b and the sacrificial members 44a and 44b are exposed in the hole STH. Further, the insulators 42 and 46 are separated into insulators 42a and 42b and insulators 46a and 46b, respectively. The etching in this step is, for example, RIE, which is anisotropic etching so that all the materials of the structures in which the trenches MT are embedded have the same etching rate.

Figure 22:
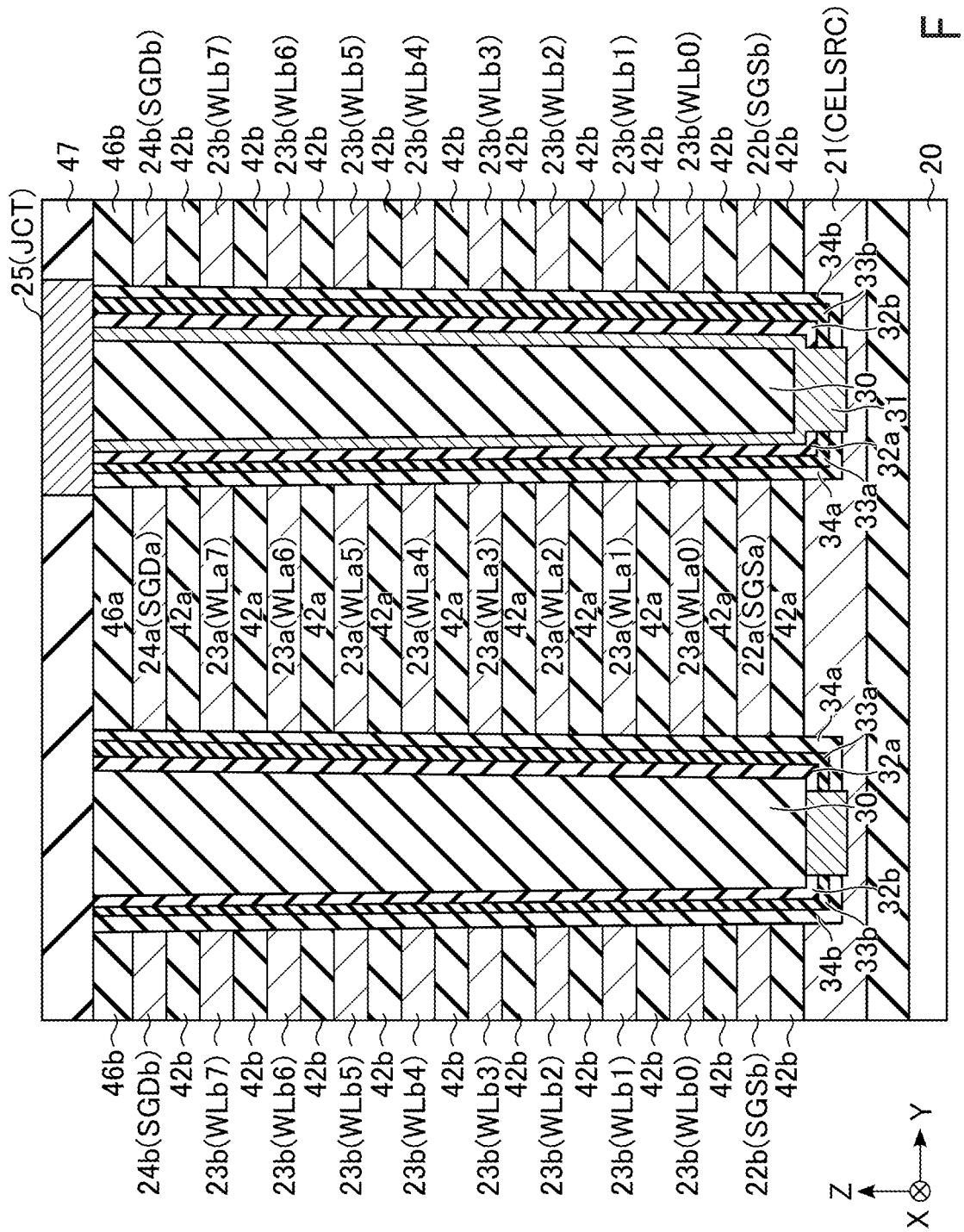
FIG. 22 is a vertical cross-sectional view of the memory cell array for explaining a manufacturing step of the semiconductor memory device of the embodiment.

Next, as shown in FIG. 22, through the hole STH, the sacrificial members 43a, 44a, and 45a are replaced with the conductors 22a, 23a, and 24a, respectively, and the sacrificial members 43b, 44b, and 45b are replaced with the conductors 22b, 23b, and 24b, respectively. FIG. 22 is a cross-sectional view of the memory cell array 10 corresponding to the region shown in FIG. 6. Specifically, the sacrificial members 43a, 44a, 45a, 43b, 44b, and 45b are selectively removed by wet etching or dry etching through the hole STH. Subsequently, the conductors 22a and 22b are formed in the spaces from which the sacrificial members 43a and 43b have been removed, respectively, the conductors 23a and 23b are formed in the spaces from which the sacrificial members 44a and 44b have been removed, respectively, and the conductors 25a and 25b are formed in the spaces from which the sacrificial members 45a and 45b have been removed, respectively.

Figure 23:
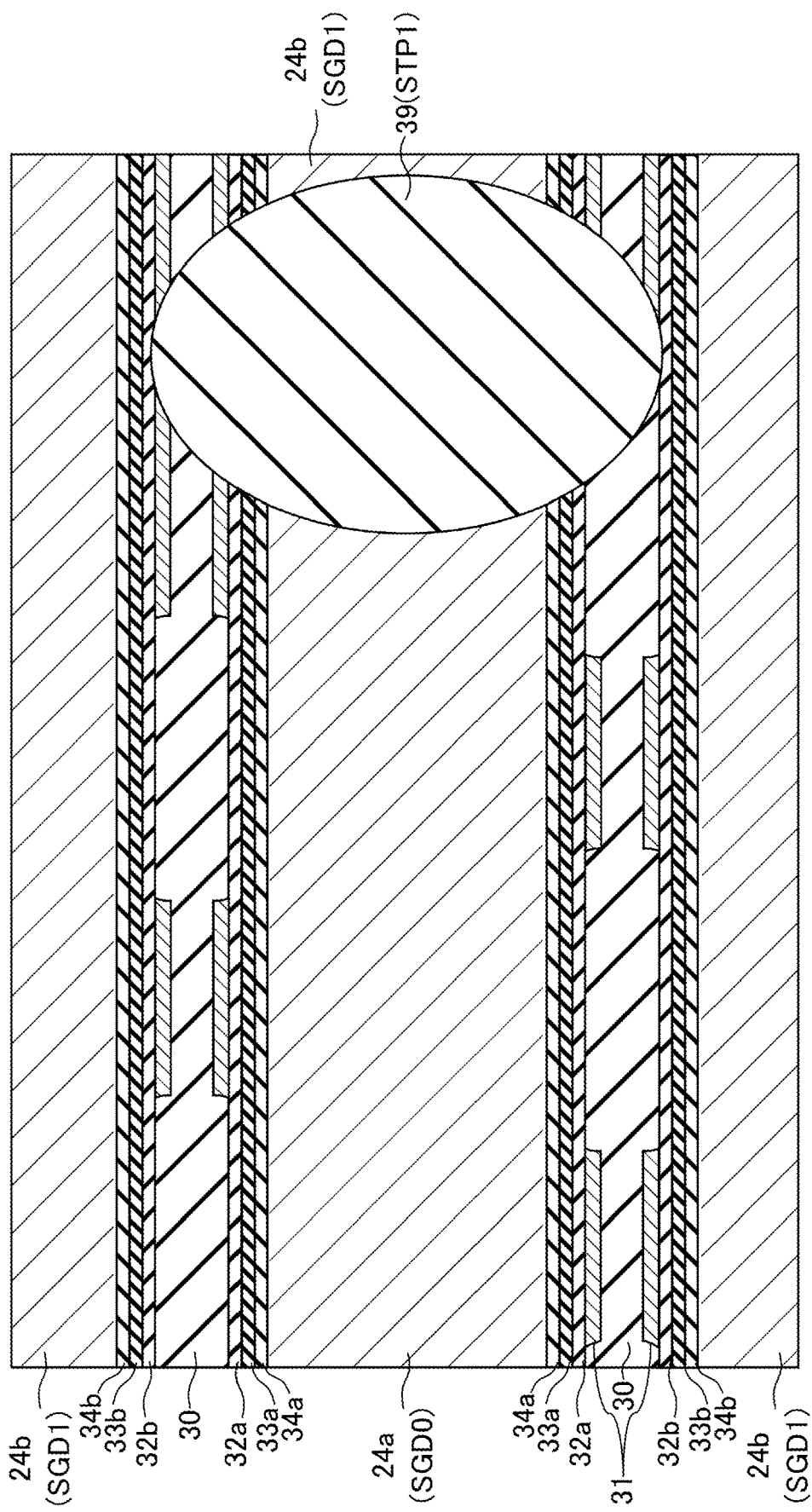
FIG. 23 is a transverse cross-sectional view of the memory cell array for explaining a manufacturing step of the semiconductor memory device of the embodiment.

Next, the hole STH is embedded with an insulator 39 as shown in FIG. 23. The insulator 39 functions as the pillar STP1 of the memory cell array 10.

By the above steps, the memory strings MSa and MSb are formed in the region where the memory structure MST is formed. After that, the memory cell array 10 is formed through a step of forming the conductors 26 and the conductors 27, a step of forming the contacts to the conductors 22a and 22b, 23a and 23b, and 24a and 24b, and the like.

The manufacturing steps described above are merely examples, and other steps may be inserted between the manufacturing steps, or the order of the manufacturing steps may be changed.

1.3 Effect of Embodiment

According to the embodiment, the integration density can be improved while suppressing the collapse of the semiconductor memory device. The effect of the embodiment will be described below.

The first stacked body has the four branch-like wiring regions respectively corresponding to the select gate lines SGDa (SGD0, SGD2, SGD4, and SGD6), and the second stacked body has the four branch-like wiring regions respectively corresponding to the select gate lines SGDb (SGD1, SGD3, SGD5, and SGD7). Each of the wiring regions included in the first stacked body and the second stacked body includes the central wiring portion L1, the plurality of peripheral wiring portions L2 and L3, and the plurality of connecting portions J1 and J2, and the plurality of peripheral wiring portions L2 and L3 are connected to the central wiring portion L1 by the plurality of connecting portions J1 and J2 on both end sides of the central wiring portion L1 along the Y direction. The peripheral wiring portions L2 (or peripheral wiring portions L3) of the wiring region corresponding to one select gate line SGD are provided between the central wiring portion L1 of the wiring region corresponding to the adjacent select gate line SGD and the peripheral wiring portions L3 (or peripheral wiring portions L2) of the wiring region corresponding to the adjacent select gate line. SGD so as to be arranged along the X direction via the connecting portions J2 (or connecting portions J1) of the wiring region corresponding to the adjacent select gate line SGD and the pillars STP1. The pillar STP1 has, for example, an elliptical shape in which the major axis is parallel to the Y direction and the minor axis is parallel to the X direction. With the shape of the wiring region and the shape of the pillar STP1 as described above, the distance between the trench structures TST adjacent to each other in the Y direction can be shortened while ensuring the axial length of the pillar STP1 along the Y direction. In other words, even when the distance between the trench structures TST adjacent to each other in the Y direction is short, the length of the hole STH along the Y direction which is formed in the region corresponding to the pillar STP1 can be sufficiently ensured in the step shown in FIG. 22 of the manufacturing steps. Thus, it is possible to suppress the occurrence of clogging of the hole STH when the sacrificial member is replaced with the conductor. Therefore, the size of the memory cell array 10 can be reduced, and the integration density can be improved.

Further, in the case of the structure of the wiring region as described above, in the step shown in FIG. 8 of the manufacturing steps, after the trench MT is formed, the portion corresponding to the central wiring portion L1 of the wiring region can be supported by the portions corresponding to the plurality of connecting portions J1 and J2 of the wiring region on both end sides along the Y direction. Therefore, the collapse of the memory cell array 10 in the manufacturing steps can be suppressed.

Further, the plurality of connecting portions J1 are arranged along the X direction at predetermined intervals. The plurality of connecting portions J2 are arranged along the X direction at the same intervals as the plurality of connecting portions J1, and are provided at positions shifted along the X direction from the plurality of connecting portions J1. As a result, the connecting portions J1 and the connecting portions J2 can be arranged in a distributed manner along the X direction at both ends of the central wiring portion L1 in the Y direction. The shape of the wiring region as described above can also suppress the collapse of the memory cell array 10 in the step shown in FIG. 8 of the manufacturing steps.

2. Modification Example

The above-described embodiment can be modified in various ways.

A semiconductor memory device according to a modification example will be described below. In the following, the description of the configuration and the manufacturing steps equivalent to those of the embodiment will be omitted, and a configuration and manufacturing steps different from those of the embodiment will be mainly described. The semiconductor memory device according to the modification example can also improve the integration density while suppressing the collapse of the semiconductor memory device as in the embodiment.

2.1 First Modification Example

In the above-described embodiment, the case where the first stacked body and the second stacked body are separated from each other due to the arrangement of the trench structures TST and the pillars STP1 is described, but the present invention is not limited to this. For example, the first stacked body and the second stacked body may be separated from each other by the trench structures TST, and the plurality of pillars STP1 may be provided in the wiring region.

A semiconductor memory device according to a first modification example will be described with reference to FIG. 24. FIG. 24 corresponds to FIG. 3 in the embodiment.

As shown in FIG. 24, in the first modification example, in addition to a plurality of trench structures TST1 to TST3 extending along the X direction, a plurality of trench structures TST4 extending along the Y direction are provided. Each of the plurality of trench structures TST4 is provided so as to connect an end portion of the trench structure TST3 provided along the X direction and an end portion of the trench structure TST1 or TST2 adjacent to the trench structure TST3 along the Y direction.

With such an arrangement, in the first modification example, the first stacked body and the second stacked body are separated from each other by the arrangement of the plurality of trench structures TST1 to TST3 extending along the X direction and the plurality of trench structures TST4 extending along the Y direction.

Further, in the first modification example, a plurality of pillars STP1 having the same shape as that of the embodiment are provided in a plurality of connecting portions J1 and J2, respectively. Each of the plurality of pillars STP1 is provided, for example, at the center position of the corresponding connecting portion J1 (or connecting portion J2) along the X direction so as not to divide a corresponding peripheral wiring portion L2 (or peripheral wiring portion L3) and a central wiring portion L1.

Next, a method of manufacturing a semiconductor memory device 1 according to the first modification example will be described.

The semiconductor memory device 1 according to the first modification example can be manufactured by steps substantially equivalent to those in FIGS. 7 to 23 described in the embodiment.

In the first modification example, in the step of FIG. 8, in addition to the regions where the plurality of trench structures TST1 to TST3 are to be formed, the regions where the plurality of trench structures TST4 are to be formed are also removed, and the trenches MT are formed. Also, by this step, sacrificial members 43, 44, and 45, and insulators 42 and 46 are separated by the trench MT into two portions 43a and 43b, 44a and 44b, 45a and 45b, 42a and 42b, and 46a and 46b, respectively.

According to the first modification example, the first stacked body and the second stacked body are separated from each other by the plurality of trench structures TST1 to TST4, and the plurality of pillars STP1 are provided in the plurality of connecting portions J1 and J2 in the wiring region, respectively, one by one. As a result, it is possible to suppress an increase in the region occupied by the plurality of pillars STP1 and suppress a decrease in the region in which the memory structures MST can be provided in the trench structure TST. Therefore, the integration density can be further improved.

2.2 Second Modification Example

In the above-mentioned first modification example, the example where the first stacked body and the second stacked body are separated from each other by the plurality of trench structures TST1 to TST4 is described, but the present invention is not limited to this. For example, the first stacked body and the second stacked body may be separated by the plurality of pillars STP1 in addition to the plurality of trench structures TST1 to TST4. In the following, the description of the configuration equivalent to that of the first modification example will be omitted, and a configuration different from that of the first modification example will be mainly described. Since a semiconductor memory device according to a second modification example can be manufactured by manufacturing steps substantially equivalent to the manufacturing steps in the embodiment and the first modification example, the description thereof will be omitted.

Figure 25:
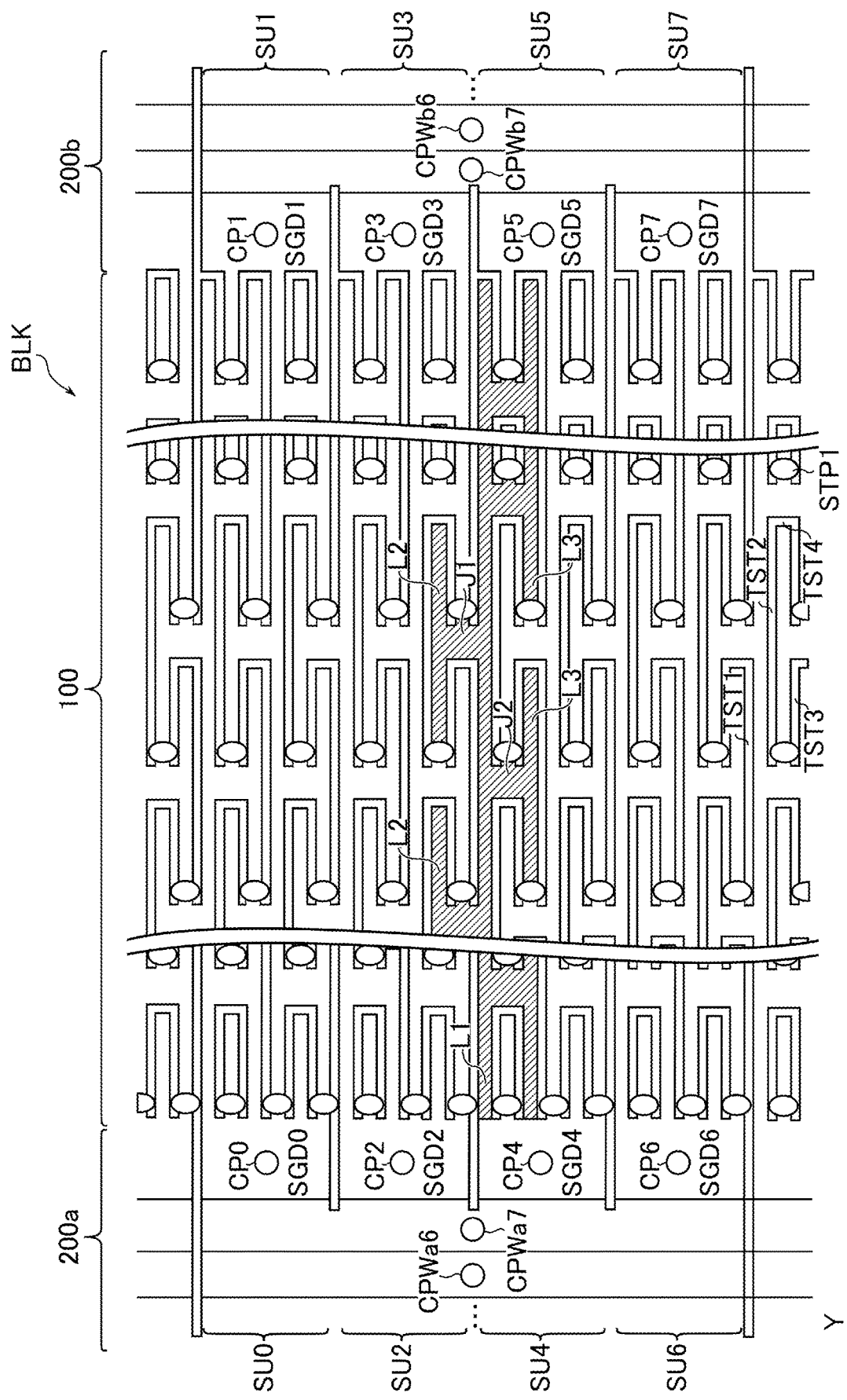
FIG. 25 is a planar layout of a memory cell array of a semiconductor memory device of a second modification example as viewed from above.

The layout of a memory cell array of a semiconductor memory device 1 according to the second modification example will be described with reference to FIG. 25. FIG. 25 corresponds to FIG. 3 in the embodiment.

As shown in FIG. 25, in the second modification example, each of a plurality of trench structures TST4 is provided so as to connect one end side (+X direction side) of a trench structure TST1 in the X direction and one end side (+X direction side) of a trench structure TST3 in the X direction which is adjacent to the trench structure TST1 along the Y direction, or one end side (+X direction side) of a trench structure TST2 in the X direction and one end side (+X direction side) of the trench structure TST3 in the X direction which is adjacent to the trench structure TST2 along the Y direction.

Each of a plurality of pillars STP1 is provided so as to connect the other end side (−X direction side) of the trench structure TST1 in the X direction and the other end side (−X direction side) of the trench structure TST3 in the X direction which is adjacent to the trench structure TST1 along the Y direction, or the other end side (−X direction side) of the trench structure TST2 in the X direction and the other end side (−X direction side) of the trench structure TST3 in the X direction which is adjacent to the trench structure TST2 along the Y direction.

With such an arrangement, in the second modification example, the first stacked body and the second stacked body are separated from each other by the arrangement of the plurality of trench structures TST1 to TST4 and the plurality of pillars STP1.

Even with such a configuration, the same effect as those of the first modification example can be obtained.

2.3 Third Modification Example

In the above-mentioned first modification example, the example where the plurality of pillars STP1 are provided in the plurality of connecting portions J1 and J2, respectively, is described, but the present invention is not limited to this. For example, each of the plurality of pillars STP1 may be provided so as to divide the trench structure TST. In the following, the description of the configuration equivalent to that of the first modification example will be omitted, and a configuration different from that of the first modification example will be mainly described. Since a semiconductor memory device 1 according to a third modification example can be manufactured by manufacturing steps substantially equivalent to the manufacturing steps in the embodiment, the first modification example, and the second modification example, the description thereof will be omitted.

Figure 26:
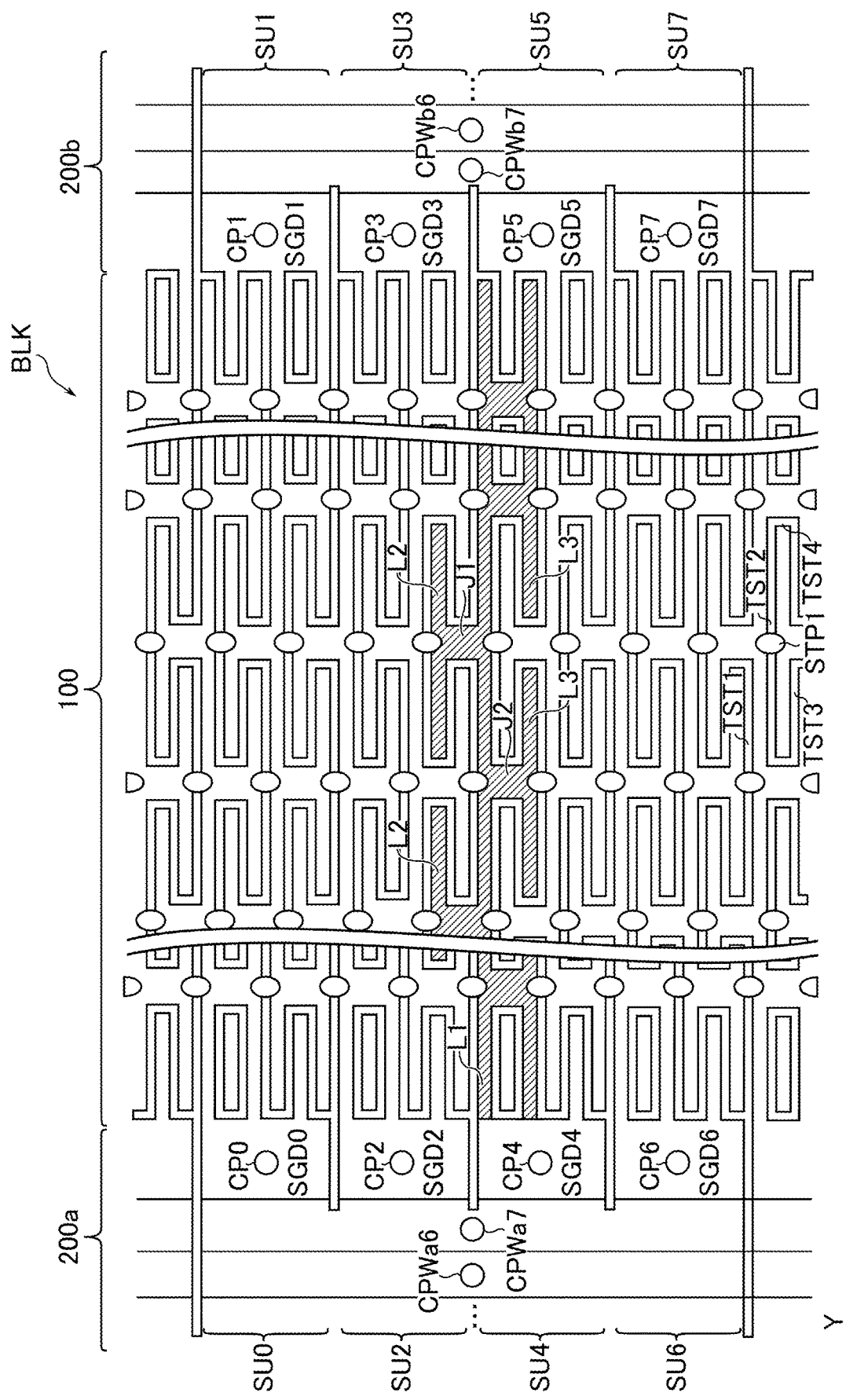
FIG. 26 is a planar layout of a memory cell array of a semiconductor memory device of a third modification example as viewed from above.

The layout of a memory cell array of the semiconductor memory device 1 according to the third modification example will be described with reference to FIG. 26. FIG. 26 corresponds to FIG. 3 in the embodiment.

As shown in FIG. 26, in the third modification example, each of a plurality of pillars STP1 is provided so as to divide a trench structure TST1 or a trench structure TST2. Each of the plurality of pillars STP1 is arranged at the center position of the corresponding trench structure TST1 or trench structure TST2 along the X direction.

Even with such a configuration, the same effect as those of the first modification example and the second modification example can be obtained.

2.4 Fourth Modification Example

In the above-mentioned third modification example, the example where the first stacked body and the second stacked body are separated from each other by the plurality of trench structures TST1 to TST4 is described, but the present invention is not limited to this. For example, the first stacked body and the second stacked body may be separated from each other by the plurality of trench structures TST1 to TST3 extending along the X direction and a plurality of pillars STP2 smaller than the plurality of pillars STP1 in plan view.

Figure 27:
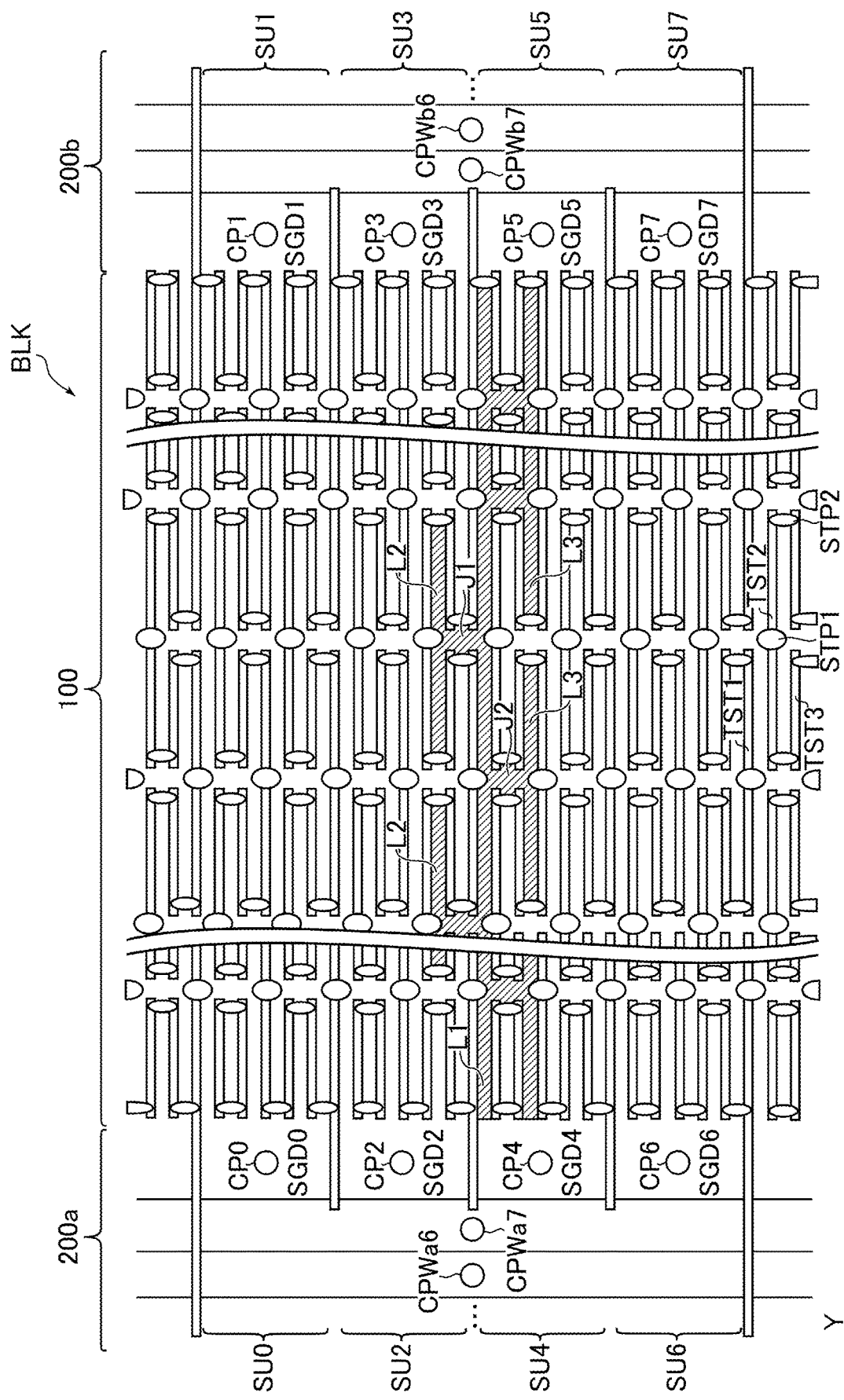
FIG. 27 is a planar layout of a memory cell array of a semiconductor memory device of a fourth modification example as viewed from above.

A semiconductor memory device 1 according to a fourth modification example will be described with reference to FIG. 27. FIG. 27 corresponds to FIG. 3 in the embodiment. In the following, the description of the configuration equivalent to that of the third modification example will be omitted, and a configuration different from that of the third modification example will be mainly described.

As shown in FIG. 27, in the fourth modification example, a plurality of pillars STP2 smaller than a plurality of pillars STP1 in plan view and having an elliptical shape in which the major axis direction is parallel to the Y direction and the minor axis direction is parallel to the X direction similarly to the plurality of pillars STP1 are provided. The plurality of pillars STP2 have a length in the major axis direction equivalent to, for example, that of the plurality of pillars STP1, and has a length in the minor axis direction shorter than that of the plurality of pillars STP1. Each of the plurality of pillars STP2 is provided so as to overlap, for example, the end portion of a trench structure TST3 and the end portion of a trench structure TST1 or TST2 adjacent to the trench structure TST3 along the Y direction.

With such an arrangement, in the fourth modification example, the first stacked body and the second stacked body are separated from each other by the arrangement of the plurality of trench structures TST extending along the X direction and the plurality of pillars STP2 smaller than the plurality of pillars STP1.

Next, a method of manufacturing the semiconductor memory device 1 according to the fourth modification example will be described.

The semiconductor memory device 1 according to the fourth modification example can be manufactured by steps substantially equivalent to those in FIGS. 7 to 23 described in the embodiment.

In the fourth modification example, in the step of FIG. 21, in the regions where a plurality of pillars STP1 and STP2 are to be formed, holes STH corresponding thereto are formed, respectively. By this step, sacrificial members 43, 44, and 45, and insulators 42 and 46 are separated into two portions 43a and 43b, 44a and 44b, 45a and 45b, 42a and 42b, and 46a and 46b, respectively.

Further, in the fourth modification example, in the step of FIG. 22, the sacrificial members 43a, 43b, 44a, 44b, 45a, and 45b are replaced by conductors 22a, 22b, 23a, 23b, 24a, and 24b, respectively, through the holes STH respectively corresponding to the pillars STP1 and STP2.

According to the fourth modification example, in addition to the plurality of pillars STP1, the plurality of pillars STP2 having a length in the minor axis direction (X direction) shorter than the plurality of pillars STP1 are provided. As a result, in the step of FIG. 22, the holes STH corresponding to the plurality of pillars STP2 can assist the replacement of the sacrificial members to the conductors through the holes STH corresponding to the pillars STP1, and thus the load of the step of replacing the sacrificial members to the conductors can be relaxed.

3. Other

The above-described embodiment and the first to fourth modification examples can be variously modified.

For example, in the above-described embodiment and the first to fourth modification examples, the case where the charge storage films 33a and 33b are formed as continuous films in the memory strings MSa and MSb, respectively, has been described. However, the present invention is not limited to this. For example, the charge storage film 33a may be provided separately for each of the plurality of memory cell transistors MCa in the memory string MSa, and the charge storage film 33b may be provided separately for each of the plurality of memory cell transistors MCb in the memory string MSb. In this case, the charge storage films provided separately may contain polysilicon or a metal containing at least one selected from titanium (Ti), tungsten (W), and ruthenium (Ru).

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A semiconductor memory device comprising:
    a first conductive layer and a second conductive layer provided in a first plane; and
    at least one memory structure provided between the first conductive layer and the second conductive layer,
    wherein the first conductive layer includes:
        a first portion, a second portion, and a third portion each extending along a first direction in the first plane, the first portion being provided between the second portion and the third portion in a second direction in the first plane which intersects the first direction;
        a fourth portion that connects the first portion and the second portion; and
        a fifth portion that connects the first portion and the third portion,
    wherein the second conductive layer includes:
        a sixth portion, a seventh portion, and an eighth portion each extending along the first direction, the sixth portion being provided between the seventh portion and the eighth portion in the second direction;
        a ninth portion that connects the sixth portion and the seventh portion; and
        a tenth portion that connects the sixth portion and the eighth portion, and wherein the second portion is provided between the sixth portion and the eighth portion in the second direction, wherein the first conductive layer further includes an eleventh portion provided at one end of the first portion in the first direction, and wherein the eleventh portion is electrically connected to a first contact on an upper surface in the first plane.

2. The semiconductor memory device of claim 1, wherein the third portion, the first portion, the eighth portion, the second portion, the sixth portion, and the seventh portion are arranged in this order in the second direction.

3. The semiconductor memory device of claim 1, wherein the first conductive layer and the second conductive layer are electrically separated from each other.

4. The semiconductor memory device of claim 1, wherein a first end of the second portion and a first end of the eighth portion are provided between the fourth portion and the tenth portion in the first direction.

5. The semiconductor memory device of claim 1, wherein the fourth portion and the fifth portion are provided at positions different from each other in the first direction.

6. The semiconductor memory device of claim 5, wherein the second portion and the seventh portion are arranged in the second direction, wherein the third portion and the eighth portion are arranged in the second direction, wherein the second portion includes a first sub portion and a second sub portion each extending along the first direction, and a third sub portion that is in contact with the fourth portion between the first sub portion and the second sub portion, wherein the third portion includes a fourth sub portion and a fifth sub portion each extending along the second direction, and a sixth sub portion that is in contact with the fifth portion between the fourth sub portion and the fifth sub portion, and wherein the first sub portion and the fifth sub portion are arranged in the second direction.

7. The semiconductor memory device of claim 6, wherein the eighth portion includes a seventh sub portion and an eighth sub portion each extending along the second direction, and a ninth sub portion that is in contact with the tenth portion between the seventh sub portion and the eighth sub portion.

8. The semiconductor memory device of claim 7, further comprising a first insulator that is in contact with the fourth portion and the eighth portion between the fourth portion and the eighth portion.

9. The semiconductor memory device of claim 8, further comprising a second insulator that is in contact with the second portion and the tenth portion between the second portion and the tenth portion.

10. The semiconductor memory device of claim 9, further comprising:

a third insulator that is in contact with the third sub portion and the sixth portion between the third sub portion and the sixth portion; and a fourth insulator that is in contact with the first portion and the ninth sub portion between the first portion and the ninth sub portion.

11. The semiconductor memory device of claim 9, further comprising:

a fifth insulator that is in contact with the third sub portion and the sixth portion between the third sub portion and the sixth portion; and a sixth insulator that is in contact with the first portion and the ninth sub portion between the first portion and the ninth sub portion.

12. The semiconductor memory device of claim 11, wherein a width of a widest portion of the first insulator and the second insulator in the first direction is narrower than a width of a widest portion of the fifth insulator and the sixth insulator in the first direction.

13. The semiconductor memory device of claim 1, further comprising:

a seventh insulator provided in the fourth portion; and an eighth insulator provided in the tenth portion.

14. The semiconductor memory device of claim 1, wherein the second conductive layer further includes a twelfth portion provided at one end of the sixth portion in the first direction on the other end side of the first portion, and wherein the twelfth portion is electrically connected to a second contact on an upper surface in the first plane.

15. The semiconductor memory device of claim 1, wherein the at least one memory structure includes:

a first memory structure provided between the first portion and the eighth portion;

a second memory structure provided between the second portion and the eighth portion; and a third memory structure provided between the second portion and the sixth portion.

16. The semiconductor memory device of claim 15, wherein the first memory structure and the third memory structure are arranged in the second direction, and wherein the second memory structure is provided at a position different from the first memory structure and the third memory structure in the first direction.

17. The semiconductor memory device of claim 1, wherein the at least one memory structure includes:

a first semiconductor and a second semiconductor;

a first charge storage portion provided between the first conductive layer and the first semiconductor; and a second charge storage portion provided between the second conductive layer and the second semiconductor.

\* \* \* \* \*